US006317368B1

(12) United States Patent
Taito et al.

(10) Patent No.: US 6,317,368 B1
(45) Date of Patent: Nov. 13, 2001

(54) SEMICONDUCTOR INTEGRATED CIRCUIT DEVICE TESTED IN BATCHES

(75) Inventors: Yasuhiko Taito; Takeshi Hamamoto; Tetsuo Kato, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/669,658

(22) Filed: Sep. 26, 2000

(30) Foreign Application Priority Data

Sep. 30, 1999 (JP) ................................. 11-279683

(51) Int. Cl.[7] .................................................. G11C 7/00
(52) U.S. Cl. ...................................... 365/189.11; 365/201
(58) Field of Search ............................. 365/230.06, 201, 365/190, 189.07, 189.05, 189.11

(56) References Cited

U.S. PATENT DOCUMENTS 5,515,334 * 5/1996 Kotani et al. .................... 365/189.11
5,680,366 * 10/1997 Kotani et al. .................... 365/189.11
5,953,261 * 9/1999 Furutani et al. ................ 365/189.05

FOREIGN PATENT DOCUMENTS 6-295599   10/1994   (JP) .

* cited by examiner

Primary Examiner—Tan T. Nguyen
(74) Attorney, Agent, or Firm—McDermott, Will & Emery

(57) ABSTRACT

Data are read out from sub-arrays within a memory cell array in batches. A data bus driving circuit compares the read data, and, according to the comparison result, drives the potentials of data buses with small amplitudes. A data retaining circuit retains fail information indicating the presence of a fail bit, according to the data on the data buses. The data retaining circuit responds to an externally supplied designation, and provides a pass/fail information output circuit with the fail information with large amplitude. The fail information is further output to the outside.

16 Claims, 15 Drawing Sheets

SEMICONDUCTOR INTEGRATED CIRCUIT DEVICE TESTED IN BATCHES

BACKGROUND OF THE INVENTION

1. Field of the Invention

The present invention relates to configurations of semiconductor integrated circuit devices, and more particularly, to a circuit configuration for a testing operation of a semiconductor integrated circuit device including a memory circuit.

2. Description of the Background Art

Due to the progress in miniaturization techniques in recent years, semiconductor memories, such as a dynamic random access memory (hereinafter, referred to as "DRAM"), have increasingly larger capacities. As the number of bits per chip has increased, the time required for the test has been lengthened. This has increased the cost for the test, and the reduction of the test time has become an important issue in the production of the semiconductor memories.

Increasing the number of semiconductor memory device chips that can be tested at one time (hereinafter, referred to a "batch count") leads to reduction in the test time per chip, which may lower the test cost.

Generally, an effort to increase the batch count, however, requires an investment for a tester device, and therefore, such increase in the batch count would not necessarily lead to the reduction in the test cost.

Now, a configuration and an operation of a tester which can test a plurality of conventional semiconductor memory devices at the same time will be described in brief.

FIG. 13 is a schematic diagram illustrating connection of a conventional tester 8000 and an m number (m is a natural number) of semiconductor memory devices 8010.1–8010.m that are simultaneously tested by tester 8000.

Semiconductor memory devices 8010.i (i is a natural number; $1 \leq i \leq m$) has external pins as follows:

(1) a power supply pin for providing power necessary for the operation of semiconductor memory device 8010.i;

(2) an address pin for input of an address for designation of an address within a memory region to semiconductor memory device 8010.i;

(3) a control pin for control of an operating mode of semiconductor memory device 8010.i; and (4) a data input/output pin for input/output of data when reading/writing data stored in semiconductor memory device 8010.i.

When testing a plurality of semiconductor memory devices 8010.1–8010.m at the same time, a common operating condition and an identical address for reading/writing can be used for them. Thus, of the above-described pins of semiconductor memory devices 8010.1–8010.m, (1) the power supply pins, (2) the address pins and (3) the control pins of the corresponding devices can be connected to common lines to receive the same signals from tester 8000, so that the relevant pins are short-circuited with one another.

Conversely, (4) the data input/output pin of each device should be monitored independently, to determine soundness thereof. Thus, tester 8000 generally has a configuration in which an output from each of semiconductor memory devices 8010.1–8010.m can be taken in separately.

Specifically, if each of semiconductor memory devices 8010.1–8010.m has an input/output bus width of 16 bits, tester 8000 should have 16×m data input/output terminals such that data can be input to or output from the respective 16×m input/output pins. In addition, tester 8000 should have a configuration allowing the m number of chip select signals to be output so that semiconductor memory devices 8010.1–8010.m can be selected independent of one another.

Therefore, in the case where semiconductor memory devices 8010.1–8010.m each having an input/output bus width of 16 bits are being measured at the same time, if the batch count is incremented by 1, the number of pins of tester 8000 should be increased by 16, and a configuration permitting the output of another chip select signal is required.

Specifically, a driving circuit for driving a pin as well as a comparison circuit for determining whether data output from semiconductor memory device 8010.1–80180.m are sound or not, should be added for every pin increased in tester 8000. Thus, the cost required for increasing the batch count becomes enormous.

Another kind of tester for testing a plurality of semiconductor memory devices 8010.1–8010.m in a batch is a burn-in tester performing a so-called burn-in test.

FIG. 14 is a schematic diagram illustrating connection in the case where such a burn-in tester 9000 is used for simultaneous measurement of an m number of semiconductor memory devices 8010.1–8010.m.

Here, burn-in tester 9000 is normally known as a low-cost test device with a large batch count.

The burn-in tester is a tester for detection of defective products, which operates semiconductor memory devices 8010.1–8010.m continuously under more stressful conditions (with a higher operating power supply voltage and a higher operating environmental temperature) than normal operating conditions for a long period of time.

In other words, the primary role in the burn-in tester is to cause semiconductor memory devices 8010.1–8010.m to operate continuously for a long period of time to reveal the presence of an initial defect. Thus, the corresponding input/output pins of respective chips are short-circuited, and therefore, the number of pins required for the burn-in tester is far less than that for general tester 8000.

Specifically, for the configuration of burn-in tester 9000, the data input/output pins corresponding to semiconductor memory devices 8010.1–8010.m are short-circuited and connected to tester 9000. Thus, even if the number of semiconductor memory devices to be measured at the same time increases, the number of data input/output terminals required for tester 9000 remains unchanged; i.e., it remains 16 if the semiconductor memory device has a data input/output bus width of 16 bits.

Accordingly, burn-in tester 9000 is more cost effective than general tester 8000 when they have the same batch count.

If the batch count increases, it is necessary to provide semiconductor memory devices 8010.0–8010.m. with the chip select signals (one ICS for each chip), but their input/output data pins may be short-circuited, as described above. Therefore, what is required for the increase in the batch count, is only to increase the number of pins according to the increment in the number of chips. Thus, it is easier for tester 9000 to increase the batch count than for the general test device 8000.

Here, however, the input/output data pins of the semiconductor memory devices are short-circuited. Therefore, if the condition of each chip is to be examined, it is necessary to select the chips, one chip at a time, and to selectively read out data from the selected semiconductor memory device 8010.i. Thus, of the pins of the simultaneously measured semiconductor memory devices 8010.1–8010.m, those for receiving chip select signals /CS cannot be short-circuited with one another.

The operating mode as described above in which chips are selected one by one for reading out data, is herein called a "scan mode".

If semiconductor memory devices 8010.1–8010.m can be tested using low-cost burn-in test 9000, the cost for testing the semiconductor memory devices would be reduced. However, with the conventional semiconductor memory devices 8010.1–8010.m, it has been difficult to test the multiple devices in batches, due to the following reasons.

As described above, in the combination of conventional burn-in tester 9000 and conventional semiconductor memory devices 8010.1–8010.m, the complementary bus inserted between the memory cell and the output buffer is equalized every time the data are read out, whereby the preceding read data are lost. Thus, even if burn-in tester 9000 performs the test programs for a plurality of chips at the same time, for the determination of pass/fail of each chip, data read out from semiconductor memory devices 8010.1–8010.m according to the execution of the test programs should be compared with an expected value one by one.

In addition, because of the specific connection for burn-in tester 9000 in which input/output pins of the plurality of semiconductor memory devices 8010.1–8010.m are being short-circuited, the data reading is only effected for one semiconductor memory device 8010.i at a time, selected by activation of a corresponding chip select signal. Therefore, to read out data from semiconductor memory devices 8010.1–8010.m during the execution of the test programs, each of semiconductor memory devices 8010.1–8010.m should be selected one by one for the data reading, every time the address changes. This has made the simultaneous measurement of multiple devices by the burn-in tester impractical.

In the above description, the semiconductor memory device, especially a DRAM, has been mentioned by way of example. However, the similar problems arise when a semiconductor integrated circuit device incorporating a semiconductor memory device and a logic circuit is being tested.

SUMMARY OF THE INVENTION

An object of the present invention is to provide a semiconductor integrated circuit device that can be tested in batches by a test device for testing a plurality of semiconductor integrated circuit devices with their input/output pins being short-circuited.

Another object of the present invention is to provide a semiconductor integrated circuit device which can output a logic level of a signal within a chip to the outside for simplification of the test.

In summary, the present invention is directed to a semiconductor integrated circuit device, which includes a control circuit, an internal circuit, a first data bus pair, a data retaining circuit, a second driving circuit, a second data bus pair, and a data output circuit. The control circuit generates first and second data output control signals for control of the operation of the semiconductor integrated circuit device, and a plurality of internal control signals. The internal circuit is controlled by the plurality of internal control signals. The internal circuit includes a first driving circuit, which has first and second output nodes and drives a potential level difference between the first and second output nodes to a first potential difference according to the data being output. The first data bus pair transmits the data output from the first and second output nodes of the first driving circuit. The data retaining circuit retains data corresponding to either a set state or a reset state. During a time period in which the first data output control signal is in an active state, the data retaining circuit attains an active state in which it is allowed to shift from the reset state to the set state, and it enters the set state when the potential level of the first data bus pair attains a prescribed value. The second driving circuit has third and fourth output nodes, and, in response to activation of the second data output control signal, drives the potential level difference between the third and fourth output nodes to a second potential difference, which is larger than the first potential difference, according to the data retained in the data retaining circuit. The second data bus pair transmits data output from the third and fourth output nodes of the second driving circuit. The data output circuit outputs the data transmitted by the second data bus pair to the outside of the semiconductor integrated circuit device.

According to another aspect of the present invention, the semiconductor integrated circuit device includes a control circuit, a memory circuit, a first data bus pair, a data retaining circuit, a second driving circuit, a second data bus pair, and a data output circuit.

The control circuit generates first and second data output control signals for control of an operation of the semiconductor integrated circuit device, and a plurality of internal control signals.

The memory circuit is controlled by the plurality of internal control signals, and sends/receives memory data to/from the outside of the semiconductor integrated circuit device. The memory circuit includes a plurality of memory cell sub-blocks. Each of the plurality of memory cell sub-blocks includes a plurality of memory cells arranged in rows and columns for storing memory data. The memory circuit further includes a first driving circuit, which has first and second output nodes, controlled by the control circuit, and drives a potential level difference between the first and second output nodes to a first potential difference, according to memory data from a memory cell selected from the plurality of memory sub-blocks in a normal operation, and according to a comparison result of a plurality of memory data read out in batches respectively from the plurality of memory sub-blocks in a test operation.

The first data bus pair transmits data output from the first and second output nodes of the first driving circuit.

The data retaining circuit retains data corresponding to either a set state or a reset state. During a time period in which the first data output control signal is in an active state, the data retaining circuit attains an active state in which it is allowed to shift from a reset state to a set state. It is set when the potential level of the first data bus pair attains a prescribed value.

The second driving circuit has third and fourth output nodes, and, in response to activation of the second data output control signal, drives a potential level difference between the third and fourth output nodes to a second potential difference larger than the first potential difference, according to the data retained in the data retaining circuit. The second data bus pair transmits data output from the third and fourth output nodes of the second driving circuit. The data output circuit outputs the data transmitted by the second data bus pair to the outside of the semiconductor integrated circuit device.

Preferably, the data output circuit is controlled by the control circuit during the time period in which the data retaining circuit is in the active state, and shifts from an inactive state to an active state in response to a designation from the outside of the semiconductor integrated circuit device.

Preferably, the data retaining circuit is further controlled by the control circuit, and retains a level of at least one of the plurality of internal control signals in response to a designation from the outside of the semiconductor integrated circuit device.

Thus, the present invention has main advantages as follows. The level change of the first complementary data bus is detected and the information about the level change is retained. Thus, in a test device for testing a plurality of semiconductor integrated circuit devices with their input/output pins being short-circuited, it is possible to test the multiple devices in batches, with a reduced test cost. Further, since the second complementary data bus has large voltage amplitude, it is possible to reliably read out the information about the level change.

Another advantage of the present invention is as follows. The data output circuit is controlled by the control circuit during the time period in which the data retaining circuit is activated, and shifts from the inactive state to the active state according to the designation from the outside of the semiconductor integrated circuit device. Thus, when the test program is executed with the input/output pins of the plurality of chips being short-circuited, it is possible to avoid collision of data output from the plurality of chips, and to prevent excessive load from being applied to the test device.

A further advantage of the present invention is that it is possible to monitor the operating states within the semiconductor integrated circuit device from the outside.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
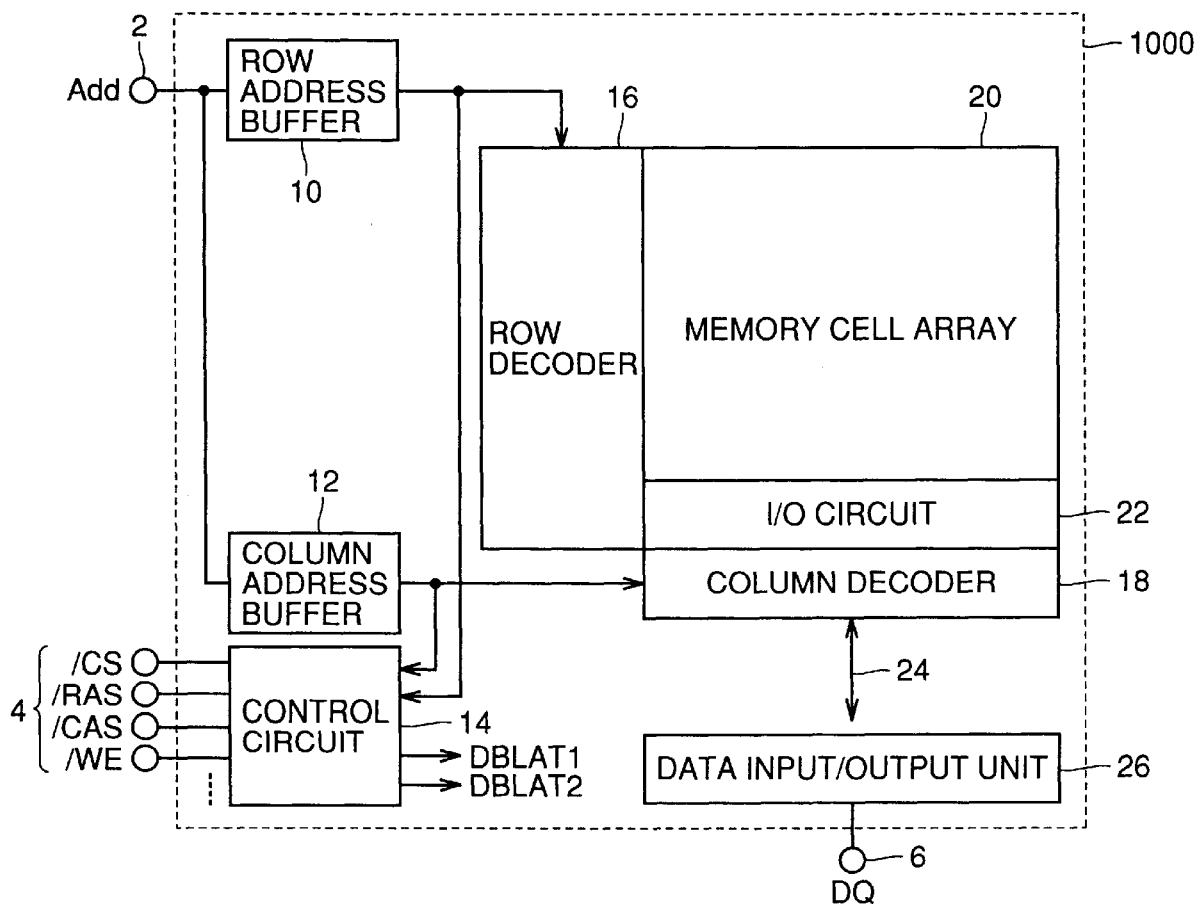
FIG. 1 is a schematic block diagram showing a configuration of a DRAM 1000 according to a first embodiment of the present invention.

A DRAM 1000 according to the first embodiment of the present invention will now be described with reference to FIG. 1. It should be understood, however, that the present invention is not only applicable to DRAM 1000, but also applicable more generally to semiconductor memory devices, and to semiconductor integrated circuit devices incorporating semiconductor memory devices.

DRAM 1000 includes: a row address buffer 10 receiving a row address signal externally supplied via an address signal input terminal 2 for buffering; a column address buffer 12 receiving a column address signal supplied via address signal input terminal 2 for buffering; and a control circuit 14 receiving an output from row address buffer 10, an output from column address buffer 12, and a chip select signal /CS, a row address strobe signal /RAS, a column address strobe signal /CAS and a write enable signal /WE supplied from an external control signal input terminal group 4, for outputting internal control signals to control an internal operation of DRAM 1000.

FIG. 1 representatively shows one address signal input terminal 2 for simplicity. In practice, however, a plurality of address signal input terminals are provided corresponding to the number of bits of the address signal.

DRAM 1000 further includes: a memory cell array 20 having a plurality of memory cells MC arranged in rows and columns, each including a memory cell capacitor C and a memory cell transistor MT; a row decoder 16 for selecting a row (a word line) in memory cell array 20 according to the output from row address buffer 10; a column decoder 18 for selecting a column (a bit line pair) in the memory cell array according to the output from column address buffer 12; an I/O circuit 22 for outputting the data read out from the memory cell column selected by column decoder 18 to the outside of the memory cell array, or providing externally supplied data to the memory cell column selected by column decoder 18; a data bus 24 for sending/receiving write data or read data to/from I/O circuit 22; and a data input/output unit 26 for sending/receiving the write data externally supplied or the read data from the memory cell array between data bus 24 and data input/output terminal 6.

Although only one data input/output terminal 6 is representatively shown in FIG. 1, a plurality of data input/output terminals are actually provided corresponding to the number of bits of the data input/output bus width.

Of the configuration shown in FIG. 1, the configuration of a read circuit for reading data from the memory cell array to data input/output terminal 6 will now be described with reference to FIGS. 2A and 2B.

Figure 2A:
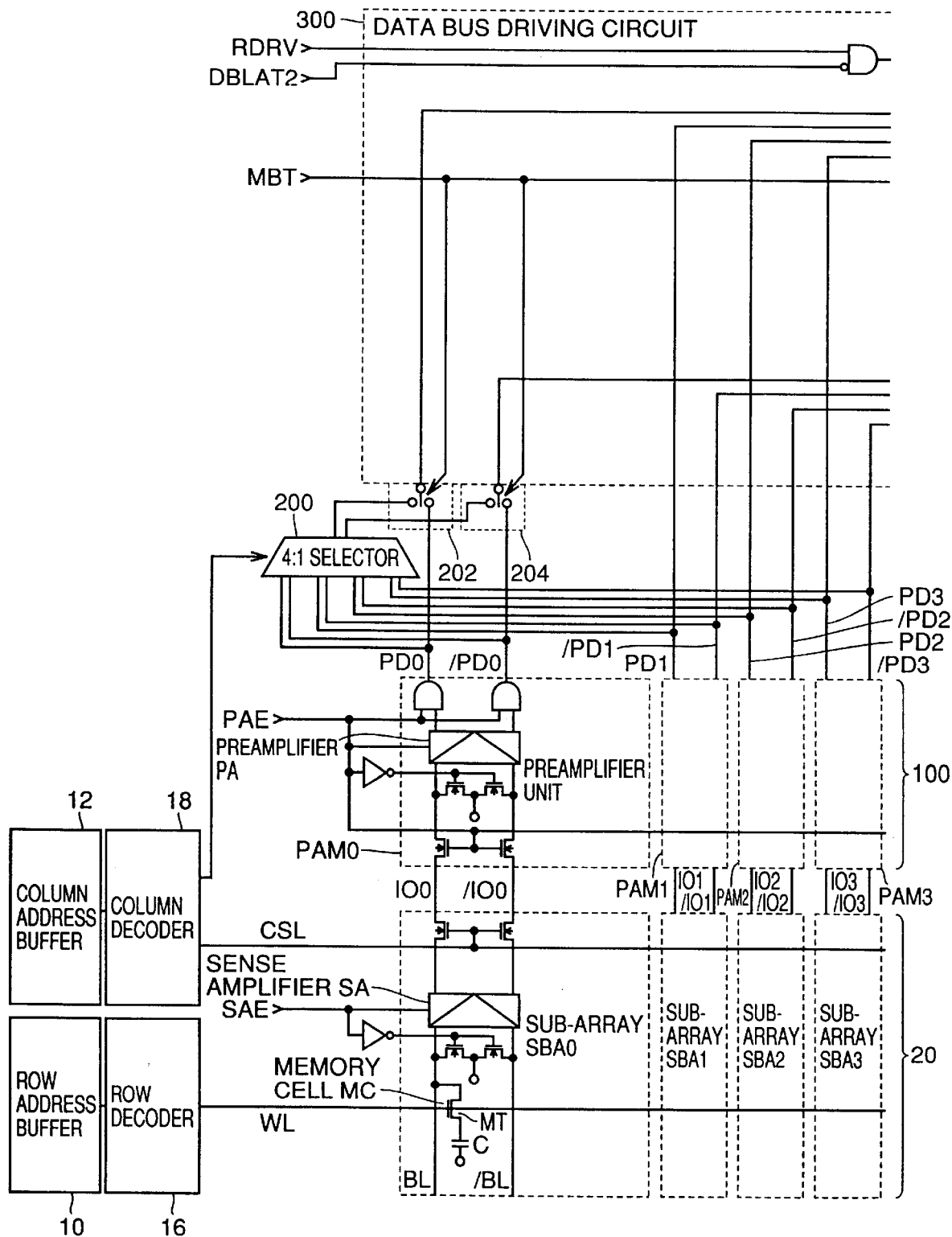
FIGS. 2A and 2B are a schematic block diagram illustrating a configuration of a read circuit for reading data from a memory cell array to a data input/output terminal 6.
Figure 2B:
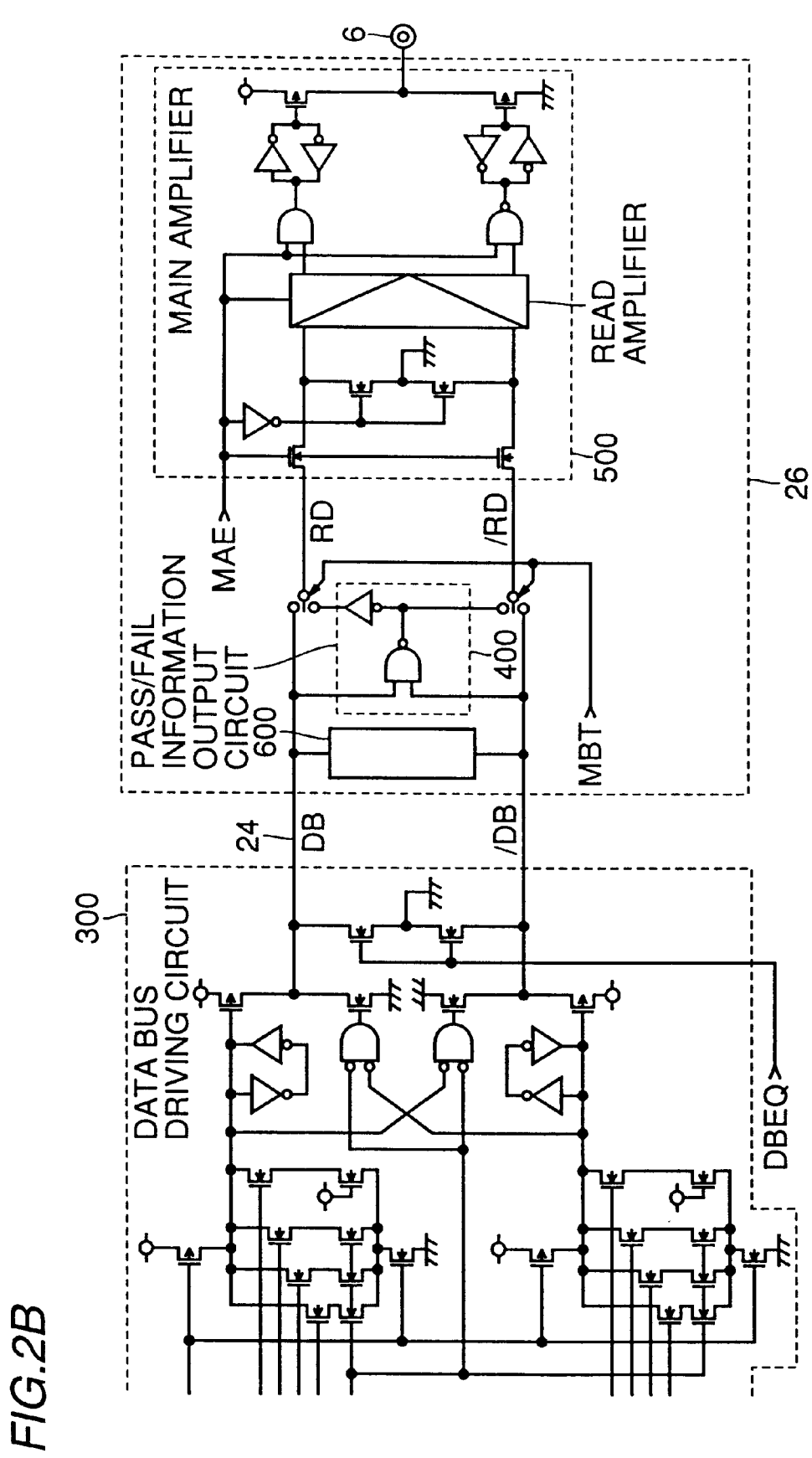

Referring to FIGS. 2A and 2B, memory cell array 20 is divided to four sub-arrays SBA0–SBA3, for example, though it is not limited thereto. FIGS. 2A and 2B representatively show a configuration in sub-array SBA0, associated with a bit line pair BL,/BL.

In sub-array SBA0, a memory cell MC is provided at a crossing of bit line pair BL, /BL and a word line WL. Memory cell MC includes a memory cell transistor MT having its gate potential level controlled by word line WL driven by row decoder 16, and a memory cell capacitor C having one end connected/disconnected with bit line pair BL by transistor MT and the other end receiving a cell plate potential Vcp.

The data read out via memory cell transistor MT to bit line BL of bit line pair BL,/BL are amplified by a sense amplifier SA. The data read out from sub-array SBA0 by a column select line CSL selectively activated by column decoder 18 are transmitted via an I/O line pair IO0, IO0 to preamplifier unit 100.

Other sub-arrays SBA1–SBA3 are provided with similar configurations. The data read out from sub-arrays SBA1, SBA2 and SBA3 are respectively supplied to corresponding preamplifier units PAM1–PAM3, via I/O line pairs IO1, /IO1; IO2, /IO2; and IO3, /IO3.

The data read out from preamplifier units PAM0–PAM3 corresponding to sub arrays SBA0–SBA3 are transmitted to a data bus driving circuit 300 via data lines PD0, /PD0–PD3, /PD3, respectively.

Here, the data on data lines PD0, /PD0–PD3, /PD3 are input directly into data bus driving circuit 300, and also supplied via 4:1 selector 200 to switch circuits 202 and 204.

Switch circuit 202 responds to multi-bit test mode signal MBT and selectively supplies to data bus driving circuit 300 any of the data transmitted from data lines PD0–PD3 selected by 4:1 selector 200 according to the output from column decoder 18.

Switch circuit 204 responds to multi-bit test mode signal MBT and selectively supplies any of the data transmitted from data lines /PD0–/PD3 selected by 4:1 selector 200 according to the output from column decoder 18, to data bus driving circuit 300.

Specifically, switch circuit 202 provides data bus driving circuit 300 with the data transmitted by data line PD0 when multi-bit test mode signal MBT is in an active state (of an "H" level), and provides the same with the data output from 4:1 selector 200 when signal MBT is in an inactive state (of an "L" level).

Similarly, switch circuit 204 provides data bus driving circuit 300 with the data transmitted by data line /PD0 when multi-bit test mode signal MBT is in the active state, and with the data selected by 4:1 selector 200 when signal MBT is in the inactive state.

Data bus driving circuit 300 equalizes data buses DB, /DB in response to a data bus equalization signal DBEQ.

Further, in a normal operating mode (with signal MBT in the inactive state), data bus driving circuit 300 drives potential levels of data buses DB, /DB in response to read driving signal RDRV, based on the data selected by 4:1 selector 200 and supplied via switch circuits 202 and 204.

On the other hand, in a multi-bit test mode with multi-bit test mode signal MBT being in the active state (of the "H" level), data bus driving circuit 300 drives the levels of data buses DB, /DB based on a comparison result of the data read out from sub-arrays SBA0–SBA3 and transmitted via data lines PD0, /PD0–PD3, /PD3.

In data input/output unit 26, in the normal operating mode, a main amplifier unit 500 drives the potential level of data input/output terminal 6 according to the data transmitted by data buses DB, /DB.

Data input/output unit 26 includes a data retaining circuit 600 for retaining a test result regarding pass/fail obtained during the multi-bit test operation period. In the multi-bit test mode, main amplifier unit 500 drives the potential level of data input/output terminal 6 according to the data output from a pass/fail information output circuit 400 based on the data retained in data retaining circuit 600.

Figure 3:
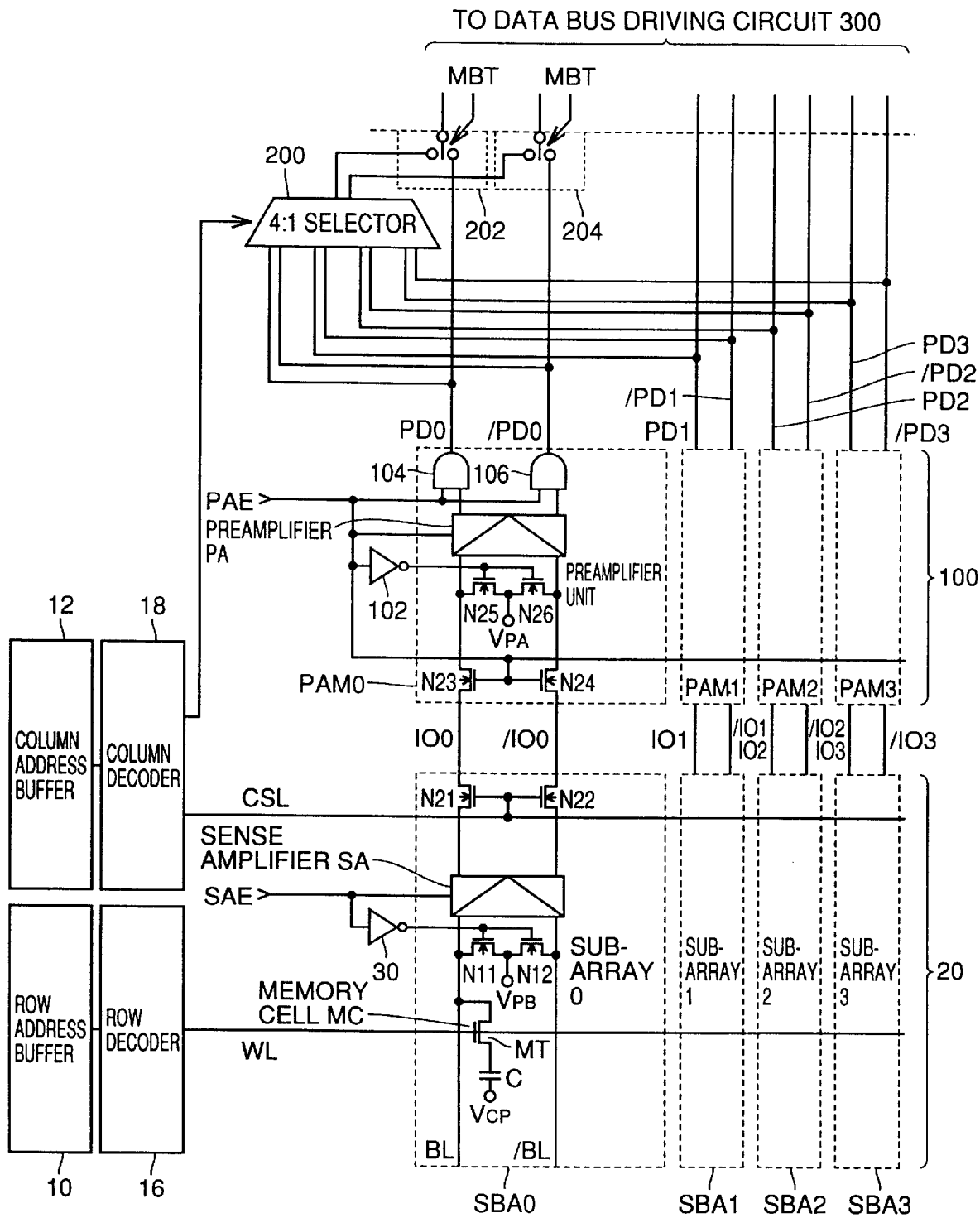
FIG. 3 is a circuit diagram illustrating configurations of a memory cell array 20, a preamplifier unit 100, a 4:1 selector 200, and switch circuits 202 and 204.

Hereinafter, the configuration shown in FIGS. 2A and 2B will be described in more detail with reference to FIG. 3, in which circuit configurations of memory cell array 20, preamplifier unit 100, 4:1 selector 200, and switch circuits 200 and 204 are shown.

Memory cell array 20 includes four sub-arrays SBA0–SBA3, as described above. In FIG. 3, one bit line pair BL, /BL in sub-array SBA0 is representatively shown. Bit line BL of this pair is connected to one end of memory cell capacitor C via memory cell transistor MT.

The other end of memory cell capacitor C receives a cell plate potential Vcp having a potential level half the power supply potential VDD, although it is not limited thereto. Connected in series between bit line pair BL, /BL are N channel MOS transistors N11 and N12, which have their gates each receiving an output of an inverter 30 that receives and inverts a sense amplifier activation signal SAE. A connection node of transistors N11 and N12 is provided with a bit line precharge potential $V_{PB}$.

Bit line precharge potential $V_{PB}$ has a potential level of VDD/2, for example, although not limited thereto.

Thus, when sense amplifier activation signal SAE is in an inactive state (of an "L" level), transistors N11 and N12 are rendered conductive, and bit lines BL, /BL are precharged to potential $V_{PB}$.

Conversely, when sense amplifier activation signal SAE is activated (to an "H" level), sense amplifier SA amplitudes the potential level of bit line pair BL, /BL. The output node of sense amplifier SA is connected to data input/output lines IO0, /IO0 via N channel MOS transistors N21 and N22, respectively. The gate potential levels of transistors N21 and N22 are selectively set to an "H" level by column select signal CSL from column decoder 18.

A plurality of bit line pairs, each having a configuration identical to that of bit line pair BL, /BL, are provided for sub-array SBA0. Sub-arrays SBA1–SBA3 each include the configuration similar to that of sub-array SBA0.

The data transmitted via I/O line pair IO0/IO0 are transmitted to a preamplifier unit PAM0 within preamplifier unit 100, corresponding to sub-array SBA0.

PAM0 includes N channel MOS transistors N23 and N24 provided between input nodes of preamplifier PA and I/O lines IO0/IO0, respectively, and N channel MOS transistors N25 and N26 connected in series between the two input nodes of preamplifier PA.

Transistors N23 and N24 have their gates controlled by preamplifier activation signal PAE, and are rendered conductive when signal PAE is in an active state (of an "H"0 level).

The connection node of transistors N25 and N26 receives a precharge potential $V_{PA}$, and the gates of transistors N25 and N26 are controlled by an output of an inverter 102 that receives signal PAE as its input.

In other words, transistors N25 and N26 are rendered conductive when signal PAE is in an inactive state, and the input nodes of preamplifier PA are set to precharge potential $V_{PA}$.

One of the complementary outputs of preamplifier PA is applied to one input node of an AND circuit 104. AND circuit 104 has its other input node receiving signal PAE.

The other of the complementary outputs of preamplifier PA is applied to one input of an AND circuit 106, which has its other input node receiving signal PAE.

The output of AND circuit 104 is supplied to data line PD0, and the output of AND circuit 106 is supplied to data line /PD0.

The similar configurations are provided for preamplifier units PAM1, PAM2, and PAM3 corresponding to sub-arrays SBA1, SBA2 and SBA3, respectively.

4:1 selector 200 receives the data transmitted from data lines PD0, /PD0–PD3, /PD3, and provides switch circuits 202 and 204 selectively with the data from any one of the data line pairs according to the signal from column decoder 18.

In the multi-bit test mode with multi-bit test mode signal MBT being in the active state, the read data from sub-arrays SBA0–SBA3 transmitted by data line pairs PD0, /PD0–PD3, /PD3 are simultaneously provided to data bus driving circuit 300 via switch circuits 202 and 204. On the other hand, in the normal operating mode, the data from any data line pair selected by 4:1 selector 200 are provided to data bus driving circuit 300 via switch circuits 202 and 204.

Figure 4:
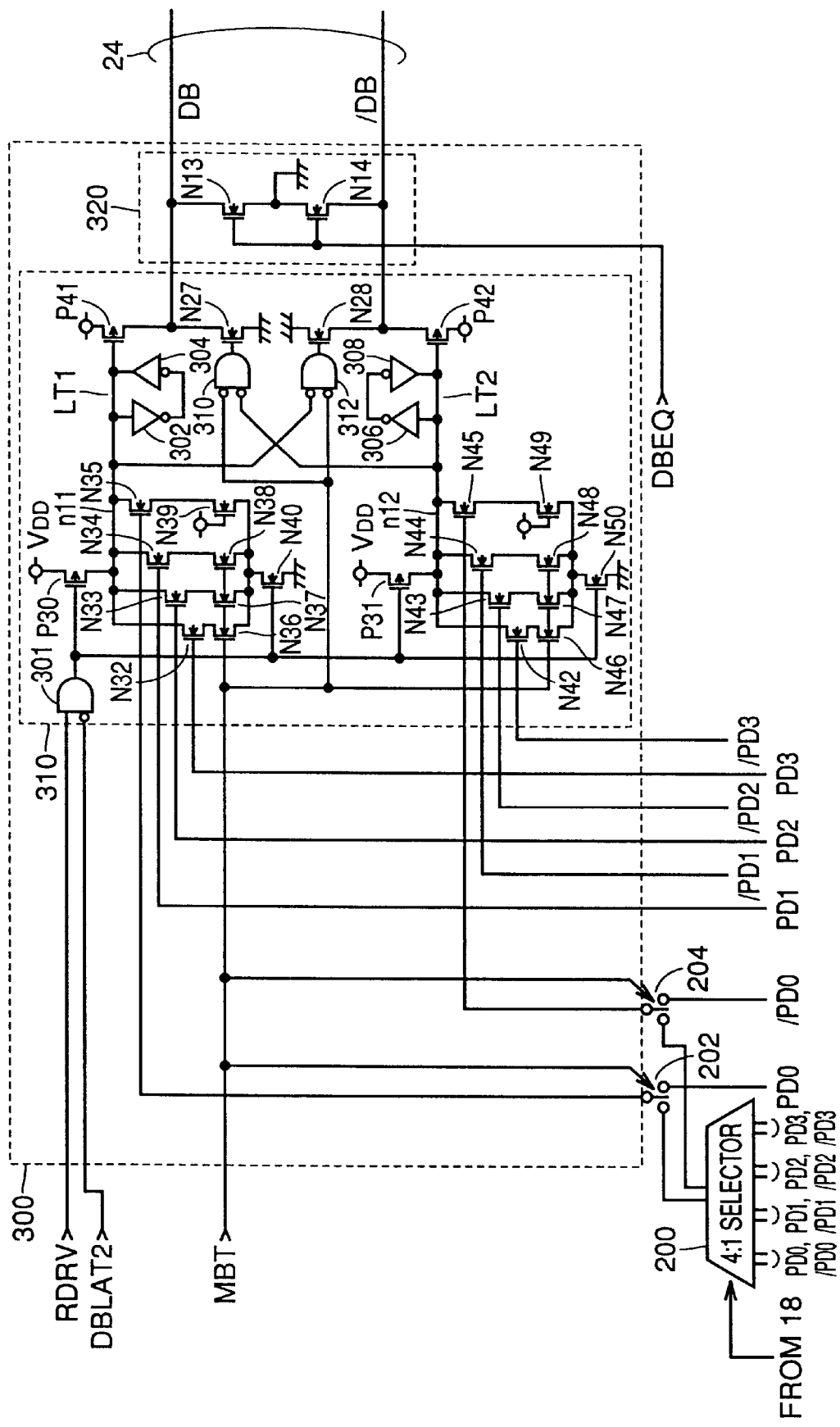
FIG. 4 is a circuit diagram illustrating a configuration of a data bus driving circuit 300.

The configuration of data bus driving circuit 300 of FIGS. 2A and 2B will now be described with reference to the circuit diagram shown in FIG. 4.

Data bus driving circuit 300 includes a comparison driving circuit 310 and an equalization circuit 320.

Comparison driving circuit 310 includes: a logic gate 301 receiving a one-shot pulse read driving signal RDRV and a control signal DBLAT2 output from control circuit 14, and outputting a logical product of a logic value of signal RDRV and an inverted logic value of signal DBLAT2; a P channel MOS transistor P30 connected between an internal node n11 and a power supply potential VDD and having its gate receiving an output of logic gate 301; an N channel MOS transistor N40 having its source connected to a ground potential GND and having its gate receiving the output of logic gate 301; N channel MOS transistors N32 and N36 connected in series between internal node n11 and a drain of transistor N40; N channel MOS transistors N33 and N37 connected in series between internal node n11 and the drain of transistor N40; N channel MOS transistors N34 and N38 connected in series between internal node n11 and the drain of transistor N40; and N channel MOS transistors N35 and N39 connected in series between internal node n11 and the drain of transistor N40.

Transistors N36, N37 and N38 have their gates receiving multi-bit test mode signal MBT, and transistor N39 has its gate receiving power supply potential VDD.

The gates of transistors N32, N33 and N34 are coupled with data lines PD3, PD2 and PD1, respectively. The gate of transistor N35 is coupled with the output of switch circuit 202.

Comparison driving circuit 310 further includes: a P channel MOS transistor P31 connected between an internal node n12 and power supply potential VDD and having its gate receiving the output of logic gate 301; an N channel MOS transistor N50 having its source coupled with ground potential GND and having its gate receiving the output of logic gate 301; N channel MOS transistors N42 and N46 connected in series between internal node n12 and a drain of transistor N50; N channel MOS transistors N43 and N47 connected in series between internal node n12 and the drain of transistor N50; N channel MOS transistors N44 and N48 connected in series between internal node n12 and the drain of transistor N50; and N channel MOS transistors N45 and N49 connected in series between internal node n12 and the drain of transistor N50.

Transistors N46, N47 and N48 have their gates each receiving multi-bit test mode signal MBT, and transistor N49 has its gate receiving power supply potential VDD.

The gates of transistors N42, N43 and N44 are coupled with data lines /PD3, /PD2 and /PD1, respectively. The gate of transistor N45 is coupled with the output of switch circuit 204.

Comparison driving circuit 310 further includes a latch circuit LT1 for holding the level of node n11, and a latch circuit LT2 for latching the output of node n12.

Latch circuit LT1 includes an inverter 302 having its input node coupled with node n11, and an inverter 304 having its input node receiving an output of inverter 302 and having its output node connected to node n11. Latch circuit LT2 includes an inverter 306 having its input node connected with node n12, and an inverter 308 having its input node receiving an output of inverter 306 and its output node connected to node n12.

Comparison driving circuit 310 further includes: an NOR circuit 312 having one input node receiving multi-bit test mode signal MBT and the other input node coupled to node n11; an NOR circuit 310 having one input node receiving multi-bit test mode signal MBT and the other input node coupled to node n12; a P channel MOS transistor P41 and an N channel MOS transistor N27 connected in series between power supply potential VDD and ground potential GND; and a P channel MOS transistor P42 and an N channel MOS transistor N28 connected in series between power supply potential VDD and ground potential GND.

The gate of transistor P41 receives the potential level of node n11, and the gate of transistor N27 receives an output of NOR circuit 310.

The gate of transistor P42 receives the potential level of node n12, and the gate of transistor N28 receives an output of NOR circuit 312.

The connection node of transistors P41 and N27 is connected to data bus DB, and the connection node of transistors P42 and N28 is connected to data bus /DB.

Equalization circuit 320 includes N channel MOS transistors N13 and N14 connected in series between data buses DB and /DB.

The connection node of transistors N13 and N14 receives ground potential GND, and the gates of transistors N13 and N14 each receive data bus equalization signal DBEQ.

The configuration of data retaining circuit 600 shown in FIGS. 2A and 2B will now be described in more detail with reference to FIG. 5.

Figure 5:
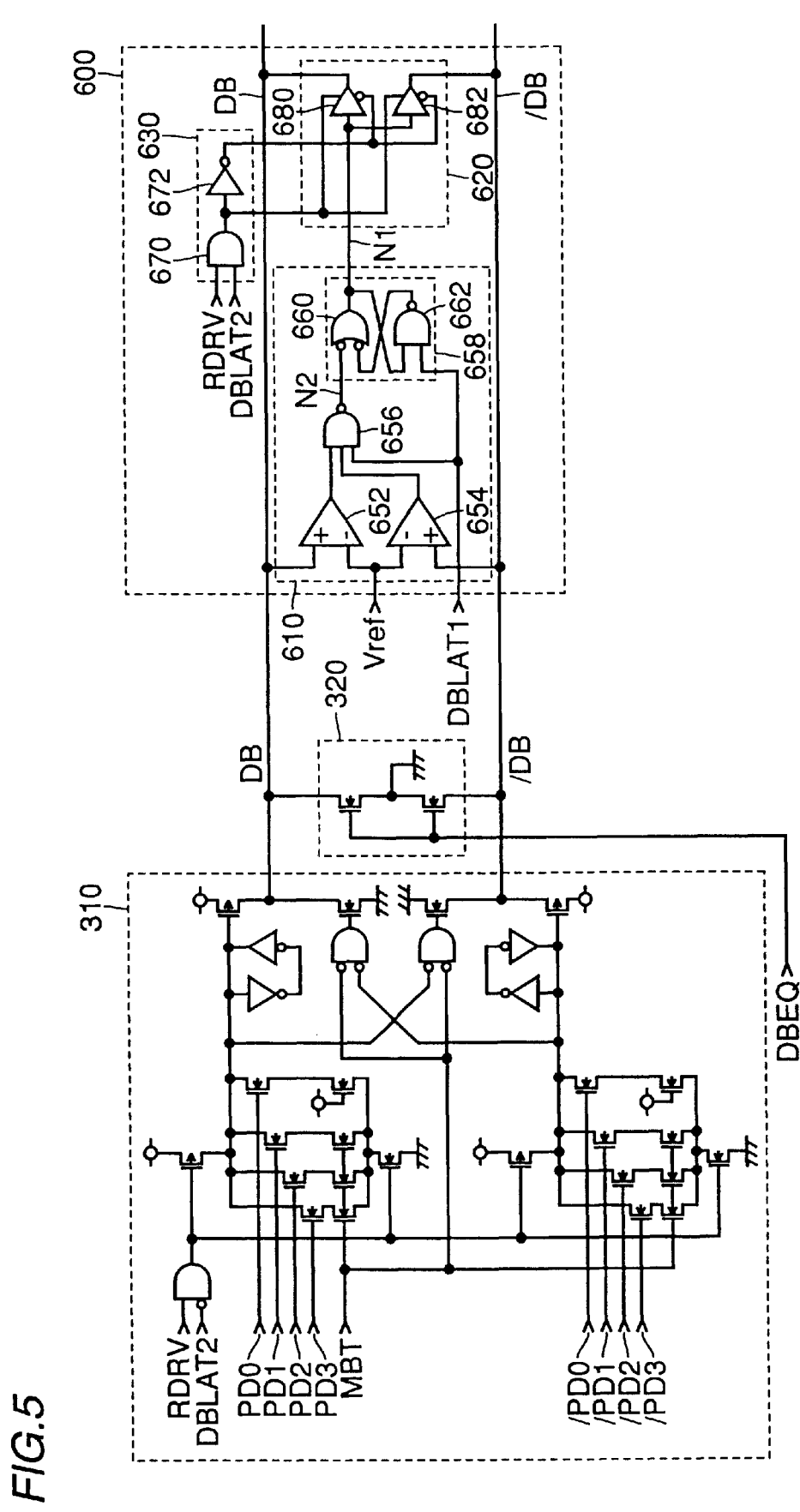
FIG. 5 is a circuit diagram illustrating a configuration of a data retaining circuit 600.

Referring to FIG. 5, data retaining circuit 600 includes: a detection retaining circuit 610 for retaining changes in the outputs of data buses DB, /DB during the multi-bit test mode; a test data driving circuit 620 for driving the potential levels of data buses DB, /DB according to the data retained in detection retaining circuit 610, to supply complementary data to pas/fail information output circuit 400; and a timing control circuit 630 for generating a timing signal to control the timing when test data driving circuit 620 drives the input level of pas/fail information output signal 400.

Detection retaining circuit 610 includes: differential amplifier circuits 652 and 654 for comparing the small amplitude signals transmitted via data buses DB, /DB with a reference potential Vref and converting the same to large amplitude signals; a NAND circuit 656 receiving outputs of differential amplifier circuits 652 and 654 and signal DBLAT1 from control circuit 14; and an RS flip-flop circuit 658 that is reset by signal DBLAT1 and set by an output of NAND circuit 656. Hereinafter, the output node of NAND circuit 656 will be called a node N2.

RS flip-flop circuit 658 includes: a NAND circuit 660 having one input node receiving an output of NAND circuit 656; and a NAND circuit 662 having one input node receiving signal DBLAT1 and the other input node receiving an output of NAND circuit 660, and having its output node coupled to the other input node of NAND circuit 660. Hereinafter, the output node of NAND circuit 660 will be called a node N1.

Timing control circuit 630 includes an AND circuit 670 receiving signals RDRV and DBLAT2, and an inverter 672 inverting an output of AND circuit 670.

Test data driving circuit 620 includes: a driving circuit 680 having its input node coupled with node N1, controlled by the outputs of AND circuit 670 and inverter 672, for driving the potential level of data bus DB to a potential corresponding to the level of node N1 in response to the event that the output of AND circuit 670 attains an "H" level; and a driving circuit 682 having its input node coupled with node N1, controlled by the outputs of AND circuit 670 and inverter 672, for driving the potential level of data bus /DB to a potential corresponding to the level of node N1 in response to the event that the output of AND circuit 670 attains the "H" level.

Now, the operation of data retaining circuit 600 will be described in brief.

Signal DBLAT1 output from control circuit 14 of FIG. 1 according to the combination of the address and control signals is a reset signal for RS flip-flop circuit 658. During a time period in which this signal DBLAT1 is at an "L" level, RS flip-flop circuit 658 is held inactive in a reset state, and the output node N1 of RS flip-flop circuit 658 retains the "L" level.

Next, when signal DBLAT1 attains an "H" level, RS flip-flop circuit 658 is released from the inactive, reset state and becomes active, so that the level held at RS flip-flop circuit 658 is allowed to change dependent on the states of complementary bus signals DB, /DB.

Immediately after the release of the inactive, reset state, RS flip-flop circuit 658 is still held at the reset state as its initial state. However, when complementary data buses DB, /DB both attain an "H" level, the outputs of differential amplifier circuits 652 and 654 both attain an "H" level, and the output level of NAND circuit 656, i.e., the level of node N2 being the set signal for RS flip-flop circuit 658 attains an "L" level, so that RS flip-flop circuit 658 enters a set state. Thus, an "H" level is held at node N1.

This set state remains unchanged until signal DBLAT1 attains the "L" level to reset RS flip-flop circuit 658.

In other words, when continuously performing a plurality of test programs with signal DBLAT1 kept at its "H" level, once a failure occurs, the potential levels of complementary data buses DB, /DB both attain the "H" level. The provision of data retaining circuit 600 allows such a state to be maintained until signal DBLAT1 attains the "L" level and RS flip-flop circuit 658 is reset.

Subsequently, signal DBLAT2 output from control circuit 14 of FIG. 1 is set to an "H" level according to the combination of the address and control signals, and a read command is provided to DRAM 1000. Then, control circuit 14 further outputs a pulse of an "H" level as a signal RDRV.

Thus, the data retained in RS flip-flop circuit 658 are output by test data driving circuit 620 to data buses DB, /DB.

Therefore, if DRAM 1000 passes all the test programs, RS flip-flop circuit 658 within data retaining circuit 600 remains in the reset state, and node N1 holds the "L" level. Thus, signals at the "L" level are output to complementary data buses DB, /DB, and data input/output terminal 6 outputs a signal of the "L" level to the outside of the chip.

Conversely, if DRAM 1000 fails even a single time during the plurality of test programs, RS flip-flop circuit 658 within data retaining circuit 600 is at the set state, and node N1 holds the "H" level. Thus, complementary data buses DB, /DB both attain the "H" level, and a signal of the "H" level is output from data input/output terminal 6 to the outside of the chip.

Therefore, even with burn-in tester 9000 for simultaneously measuring a plurality of semiconductor memory devices with their input/output pins being short-circuited, the plurality of test programs can be executed keeping signal DBLAT1 in every device at the "H" level, and when all the test programs are completed, signal DBLAT2 can be set to the "H" level. Thus, it is possible to select the semiconductor memory devices one by one for reading data therefrom, to determine soundness of each chip.

During the data reading, the logic amplitudes of complementary data buses DB, /DB are kept small, to achieve high-speed data reading. On the other hand, during the output of the pass/fail determination result, test data driving circuit 620 is configured to output the determination information with large logic amplitudes, since avoidance of misreading of the determination result is more important than the speed of reading.

In other words, during the data reading, data bus equalization circuit 320 first equalizes data buses DB, /DB to the ground potential. Then, a short, one-shot pulse is applied as read driving signal RDRV, and complementary data buses DB, /DB are driven by comparison driving circuit 310.

At this time, the time width of the one-shot pulse applied as signal RDRV is set smaller than the logic amplitudes of data buses DB, /DB, to speed up the reading. Thus, the logic amplitudes of complementary data buses DB, /DB are smaller than the potential difference between the ground potential and the power supply potential.

Conversely, after the completion of the test programs, when reading out the pass/fail determination results from data retaining circuit 600, the output level of test data driving circuit 620 is made to fully swing between the ground potential and the power supply potential such that the risk of misreading of the determination results is reduced. Otherwise, the misreading of data from data retaining circuit 600 will lead directly to misjudgment.

Figure 6:
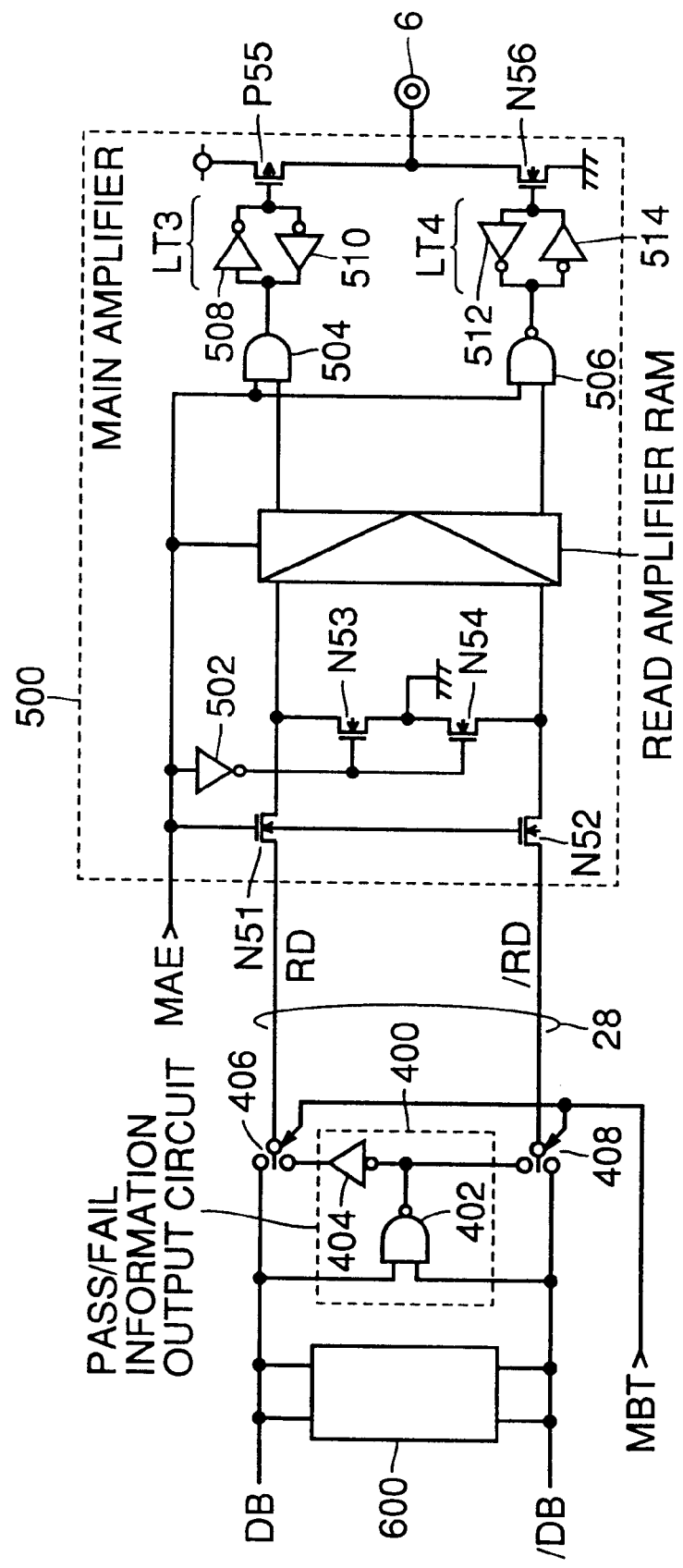
FIG. 6 is a circuit diagram illustrating configurations of a pass/fail information output circuit 400 and a main amplifier unit 500.

The configurations of pass/fail information output circuit 400 and main amplifier unit 500 shown in FIGS. 2A and 2B will now be described with reference to the circuit diagram of FIG. 6.

Pass/fail information output circuit 400 includes: a NAND circuit 402 having its input nodes connected with data buses DB and /DB, respectively; and an inverter circuit 404 receiving an output of NAND circuit 402.

Switch circuit 406 is controlled by the multi-bit test mode signal, and outputs, as read data RD, either an output of inverter 404 or a potential level transmitted via data bus DB.

Switch circuit 408 selectively outputs, as read data /RD, the output of NAND circuit 402 and a potential level transmitted via data bus /DB, according to multi-bit test mode signal MBT.

Read data RD and /RD are signals complementary to each other.

Here, if multi-bit test mode signal MBT is in an inactive state, switch circuits 406 and 408 output as read data RD, /RD the data transmitted via data buses DB, /DB without altering them, to complementary data bus 28.

Conversely, if multi-bit test mode signal MBT is in an active state, the outputs of inverter 404 and NAND circuit 402 are output as read data RD, /RD to complementary data bus 28.

Main amplifier unit 500 includes: a read amplifier RAM; an N channel MOS transistor N51 connected between one input node of read amplifier RAM and an output of switch circuit 406; and an N channel MOS transistor N52 provided between the other input node of read amplifier RAM and the output node of switch circuit 408. N channel MOS transistors N51 and N52 have their gates each controlled by a main amplifier activation signal MAE.

Specifically, transistors N51 and N52 are rendered conductive when signal MAE is in an active state (of an "H" level).

Main amplifier unit 500 further includes N channel MOS transistors N53 and N54 connected in series between one and the other input nodes of read amplifier RAM.

The connection node of transistors N53 and N54 is coupled with ground potential GND, and the gates of transistors N53 and N54 each receive an output of inverter 502 that receives signal MAE as its input.

Therefore, transistors N53 and N54 are rendered conductive when signal MAE is in an inactive state (of an "L" level), and the input nodes of read amplifier RAM are set to ground potential GND.

Main amplifier unit 500 further includes: an AND circuit 504 having one input node receiving signal MAE and the other input node receiving one output of read amplifier RAM; a NAND circuit 506 having one input node receiving signal MAE and the other input node receiving the other output of read amplifier RAM; a latch circuit LT3 latching an output of AND circuit 504; and a latch circuit LT4 latching an output of NAND circuit 506.

Latch circuit LT3 includes: an inverter 508 receiving the output of AND circuit 504 as its input, and an inverter 510 receiving an output of inverter 508 as its input and having its output node connected with the input node of inverter 508. Latch circuit LT4 includes: an inverter 514 receiving the output of NAND circuit 506, and an inverter 512 receiving an output of inverter 514 as its input and having its output connected with the input of inverter 514.

Main amplifier unit 500 further includes a P channel MOS transistor P55 and an N channel MOS transistor N56 connected in series between power supply potential VDD and ground potential GND.

The connection node of transistors P55 and N56 is connected to data input/output terminal 6. The gates of transistors P55 and N56 receive the outputs of inverters 508 and 514, respectively.

Data Reading Operation

Figure 7:
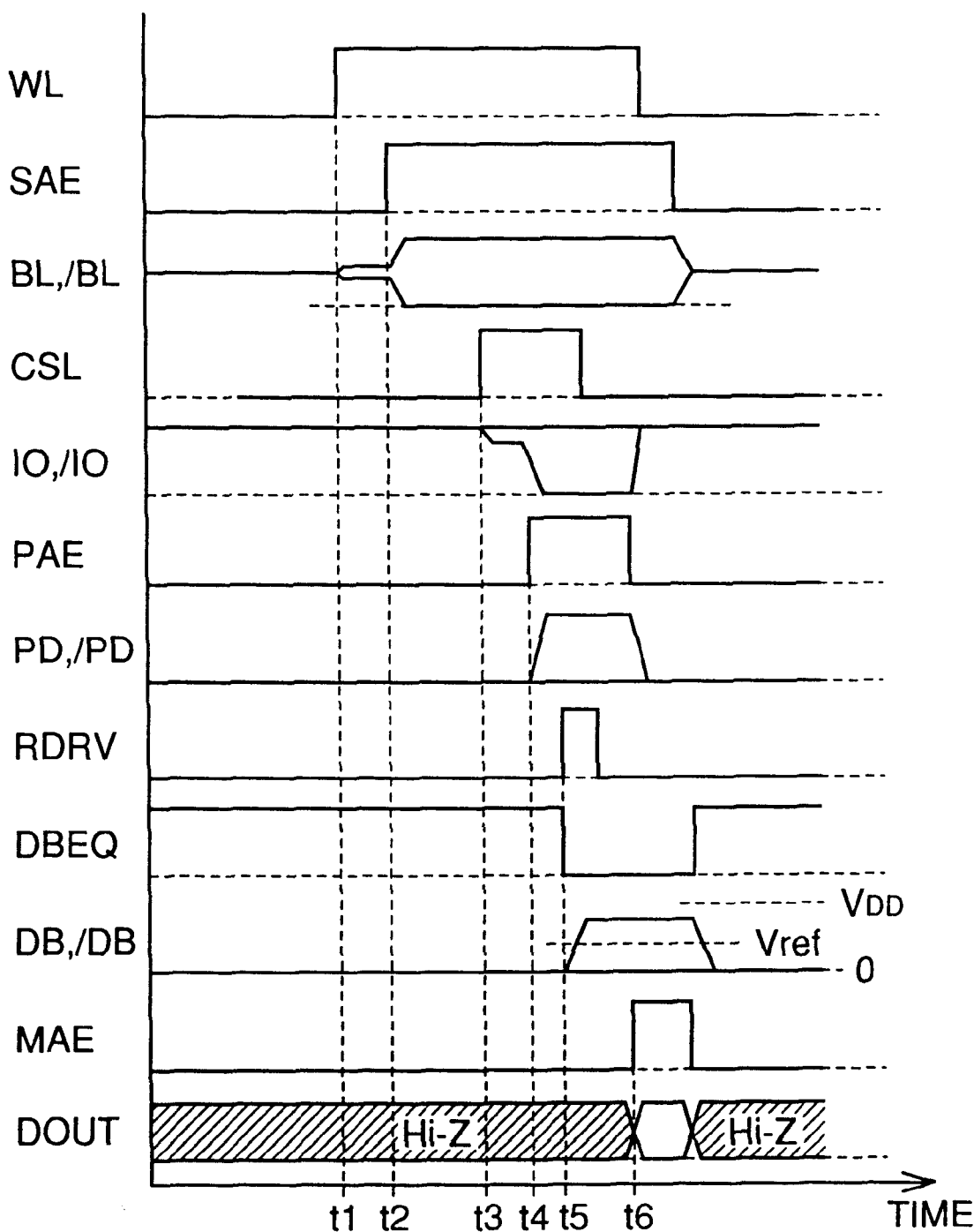
FIG. 7 is a timing chart illustrating an operation for reading data from a memory cell MC to data input/output terminal 6 in DRAM 1000.

The operation of DRAM 1000 for reading data from memory cell MC to data input/output terminal 6 will be described with reference to the timing chart shown in FIG. 7.

A normal reading operation (when multi-bit test mode signal MBT is at an "L" level) is performed in the following order.

First, at time t1, word line WL is selected according to an input row address and enters an active state. In response thereto, for every memory cell connected to the selected word line, a minute voltage difference is created between bit line pair BL, /BL, according to the charge stored at the capacitor within the memory cell.

At time t2, sense amplifier activation signal SAE attains an "H" level and, in response, the sense amplifier is activated, and the minute voltage difference between bit line pair BL, /BL is amplified.

At time t3, column select line CSL selects I/O line pairs designated by the input column address.

Subsequently, at time t4, preamplifier activation signal PAE attains an "H" level, and thus, the potential differences of the selected I/O line pairs are amplified by preamplifiers PAM0–PAM3 and output to data line pairs PD0, /PD0–PD3, /PD3.

4:1 selector 200 selects data in response to the signal from column decoder 18, which data are provided via switch circuits 202, 204 to data bus driving circuit 300.

Up to time t5, data buses DB, /DB are equalized to the ground potential by data bus equalization circuit 320. After the equalization of the data buses is released at time t5, data bus driving circuit 300 buffers the data transmitted via the selected one of data line pairs PD0, /PD0–PD3, /PD3. Data buses DB, /DB are driven to corresponding potential levels in response to the activation of signal RDRV.

At time t6, signal MAE is activated. Thus, the potential difference between data buses DB, /DB is amplified by main amplifier unit 500, and is output as a logic value from data input/output terminal 6 to the outside.

Specifically, read amplifier RAM is activated as main amplifier activation signal MAE attains the "H" level. The potential difference between data buses DB, /DB is amplified, so that a binary logical value of "H" level or "L" level is obtained. Transistors P55 and N56 are driven in response to the output of this read amplifier RAM, and the read data are externally output via data input/output terminal 6.

In the data read circuit having the configuration as described above, in the data reading, complementary data buses (DB, /DB or the like) are first equalized and then driven to their potential levels according to the read data. Therefore, every time a data reading is performed, the data in the preceding read cycle are lost.

Figure 14:
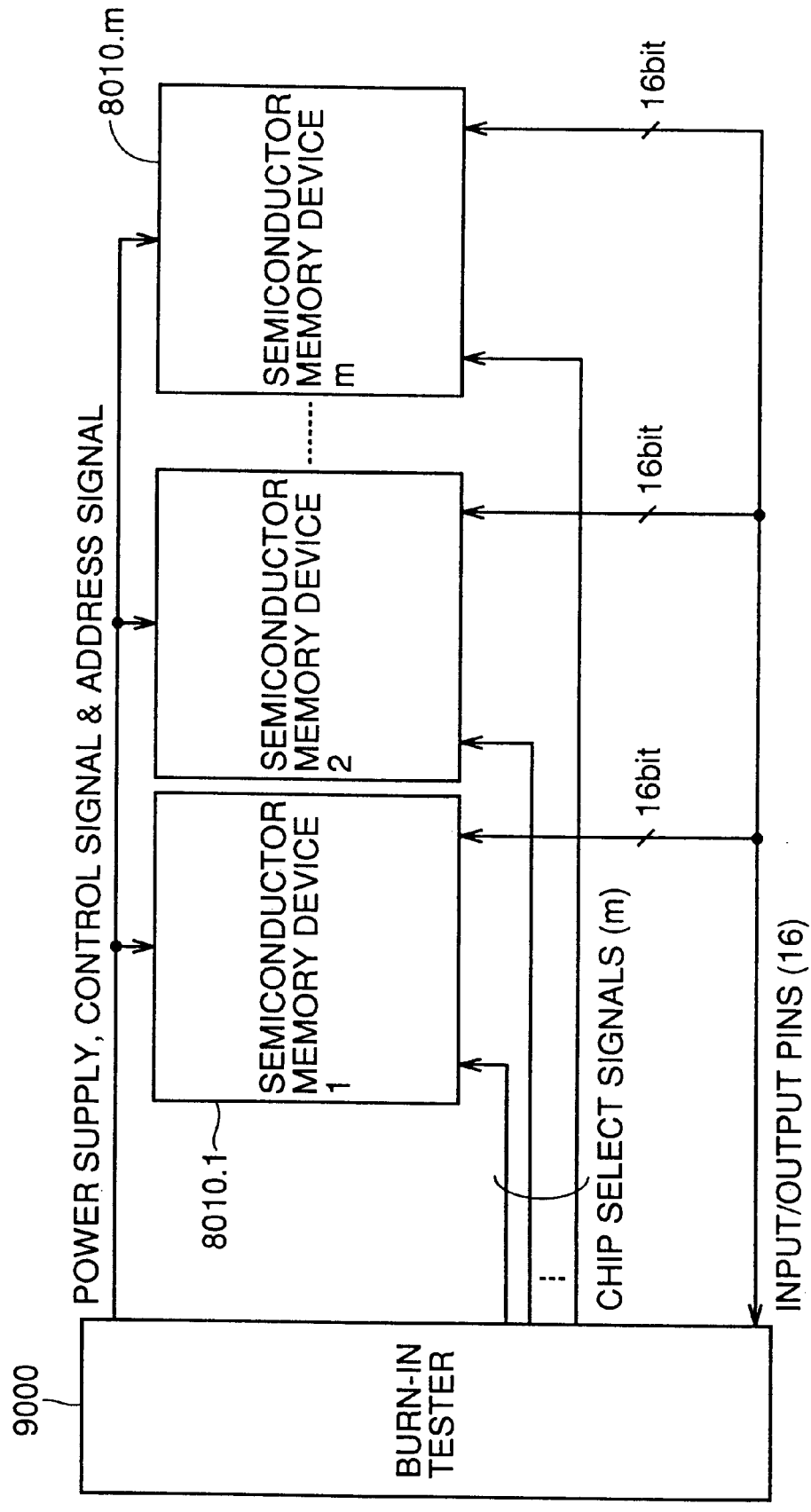
FIG. 14 is a schematic diagram illustrating connection in the case where a burn-in tester 9000 is used for simultaneous measurement of an m number of semiconductor memory devices 8010.1–8010.m.

Thus, it is difficult for burn-in tester 9000 as shown in FIG. 14 to simultaneously measure a plurality of DRAMs 1000 in a normal operating mode.

This is because, as described above, when reading data in the normal operation, the complementary data buses are equalized before being driven according to read data, so that the preceding read data are lost every time data reading is performed.

If data retaining circuit 600 is not provided, even in the multi-bit test mode operation, it will be difficult for burn-in tester 9000 to measure several DRAMs 1000 at one time, because of the similar reason.

Now, the operation of the circuit shown in FIGS. 2A and 2B in the multi-bit test operation will be described in brief.

As seen in FIGS. 2A and 2B, memory cell array 20 is divided into four sub-arrays SBA0–SBA3.

In the multi-bit test, same data are written into memory cells at corresponding addresses in respective sub-arrays. In the data reading, the data from respective sub-arrays are compared with one another, and according to their match/mismatch, pass/fail is determined.

Specifically, in the circuit configuration shown in FIGS. 2A and 2B, when multi-bit test mode signal MBT is active (at the "H" level), the outputs DB, /DB of data bus driving circuit 300 become as follows.

TABLE 1

|  | DB | /DB |
|---|---|---|
| Data from I00 - 3 are all "H" and data from /I00 - 3 are all "L" (match) | "H" | "L" |
| Data from I00 - 3 are all "L" and data from /I00 - 3 are all "H" (match) | "L" | "H" |
| Data from I00 - 3 and /I00 - 3 both include "L" and "H" (mismatch) | "H" | "H" |

According to Table 1, read data RD and /RD both attain "H" level only when the data mismatch among the sub-arrays, when a signal at the "H" level is output from data input/output terminal 6.

Otherwise, a signal at the "L" level is output from data input/output terminal 6.

Thus, in the multi-bit test operation, if the data level at the data input/output terminal 6 is the "L" level, it means that the read results from all the sub-arrays match with one another, so that it is determined as "pass". On the contrary, if the output level from data input/output terminal 6 is the "H" level, it means that the read results from the sub-arrays mismatch. Thus, it is determined as "fail".

In the circuit shown in FIGS. 2A and 2B, the determination of pass/fail can be made by simultaneously reading data out of the four sub-arrays by the multi-bit test. Such a procedure requires ¼ of the time necessary when writing and reading of data are performed in the four sub-arrays while corresponding addresses are being sequentially provided thereto.

The multi-bit test operation in the circuit of FIGS. 2A and 2B will now be described with reference to the timing chart shown in FIG. 8.

First, at time t0, control signal DBLAT1 from control circuit 14 attains an active state (at an "H" level).

Subsequently, at time t1, word line WL is selected and activated according to the row address input, as in FIG. 7. In response to the event that sense amplifier activation signal SAE attains an "H" level at time t2, the sense amplifier is activated, and the minute voltage difference between bit line pair BL, /BL is amplified.

At time t3, column select line CSL selects I/O line pairs designated by a column address input.

Subsequently, at time t4, preamplifier activation signal PAE attains an "H" level, and the potential differences on the selected I/O line pairs are amplified by preamplifiers PAM0–PAM3, and output to data line pairs PD0, /PD0–PD3, /PD3.

The data from data line pairs PD0, /PD0–PD3, /PD3 are all supplied to data bus driving circuit 300.

Up to time t5, data buses DB, /DB are equalized to the ground potential by data bus equalization circuit 320. After the equalization of the data buses is released at time t5, the data transmitted by data line pairs PD0, /PD0–PD3, /PD3 are compared by data bus driving circuit 300. According to the comparison result, data buses DB, /DB are driven to corresponding potential levels in response to the activation of signal RDRV. Accordingly, data corresponding to the comparison result are retained in RS flip-flop circuit 658 within data retaining circuit 600.

At time t6, when signal MAE is activated in response to the fact that there is created a small amplitude potential difference between the data buses, data are output as output signal DOUT. In the test mode, however, data reading from data retaining circuit 600 is further performed, which will be described later.

At time t7, signal DBEQ is activated again, so that the levels of data buses are equalized.

Figure 8:
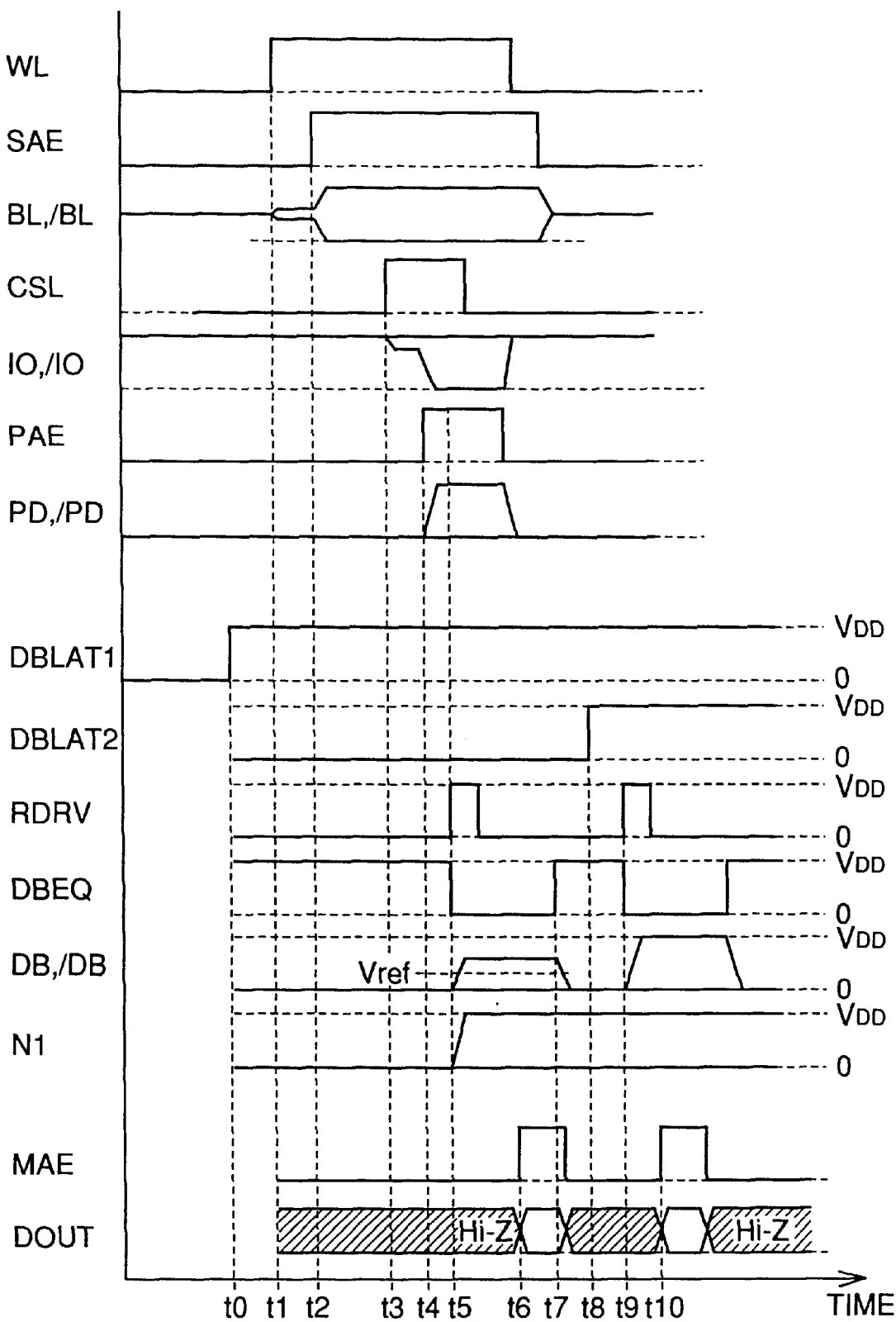
FIG. 8 is a timing chart illustrating a multi-bit test operation in the circuit show in FIGS. 2A and 2B.

In FIG. 8, the data reading and comparison operation in the multi-bit test mode is illustrated only one time for simplicity. In practice, however, the data reading and comparison operation as well as the data bus equalization operation are repeated several times, with the addresses being changed, during the time period from t5 to t7.

At time t8, signal DBLAT2 is activated. At time t9, signal DBEQ is inactivated, and the equalization of data buses is released. Further, as signal RDRV is activated, the potential levels of data buses DB, /DB are made to fully swing to the power supply potential or to the ground potential.

At time t10, signal MAE is activated, and the potential difference between read data RD and /RD is amplified by main amplifier unit 500, and is externally output from data input/output terminal 6 as a logic value. This logic value is based on the potential of data buses DB, /DB that has been made to fully swing. Thus, it is possible to reliably determine the level of the logic value even if the reading is performed by the tester.

According to the configuration of the data read circuit as explained above, in the multi-bit test operating mode, it is possible to reduce the time required for the test by reading out the data regarding match/mismatch obtained from the sub-arrays. Moreover, such a test can be performed for a plurality of semiconductor integrated circuit devices in batches, utilizing a burn-in tester that tests several devices with their input/output pins being short-circuited. This results in the reduction of the test cost.

Second Embodiment

The configuration of a read circuit according to the second embodiment of the present invention will now be described with reference to FIG. 9.

The read circuit according to the present embodiment includes a main amplifier control circuit 700 in addition to the configuration of the read circuit according to the first embodiment shown in FIGS. 2A and 2B.

Main amplifier control circuit 700 includes: a logic gate circuit 702 receiving inverted levels of signals DBLAT1 and DBLAT2 to output their NAND logical operation result; and an AND circuit 704 receiving an output of logic gate circuit 702 and signal MAE to generate a signal for designating an activation to read amplifier RAM.

The provision of main amplifier control circuit 700 can prevent, as will be explained below, collision of data output from a plurality of chips when they are being tested with their input/output pins being short-circuited.

Specifically, assume that the test is performed while corresponding input/output pins of the plurality of chips are being short-circuited. In this case, if some chips output signals at the "H" level and other chips output signals at the "L" level, a large current will flow between the ground potential and the power supply of the test device. If a great number of chips cause the data collision, the current will become so large that it may burn a power supplying circuit from the tester to the chips.

To avoid such a risk, the read circuit according to the second embodiment is provided with main amplifier control circuit 700. Main amplifier control circuit 700 is configured to prohibit activation of an output buffer during the period in which signal DBLAT1 is at the "H" level and data retaining circuit 600 is released from the inactive, reset state, unless signal DBLAT2 attains an "H" level.

Thus, in the case where a plurality of chips are simultaneously measured with their corresponding input/output pins being short-circuited, a plurality of test programs are first performed with signal DBLAT1 held at the "H" level and signal DBLAT2 at the "L" level, and the pass/fail information is accumulated in data retaining circuit 600. Thereafter, signal DBLAT2 is set to the "H" level and the chips are selected one by one to read out the pass/fail information. Accordingly, it is possible to avoid collision of the output data from the chips during the execution of the test programs.

The operation of the read circuit shown in FIG. 9 in the multi-bit test mode will now be described with reference to the timing chart of FIG. 10, which is compared to FIG. 8 of the first embodiment.

Figure 10:
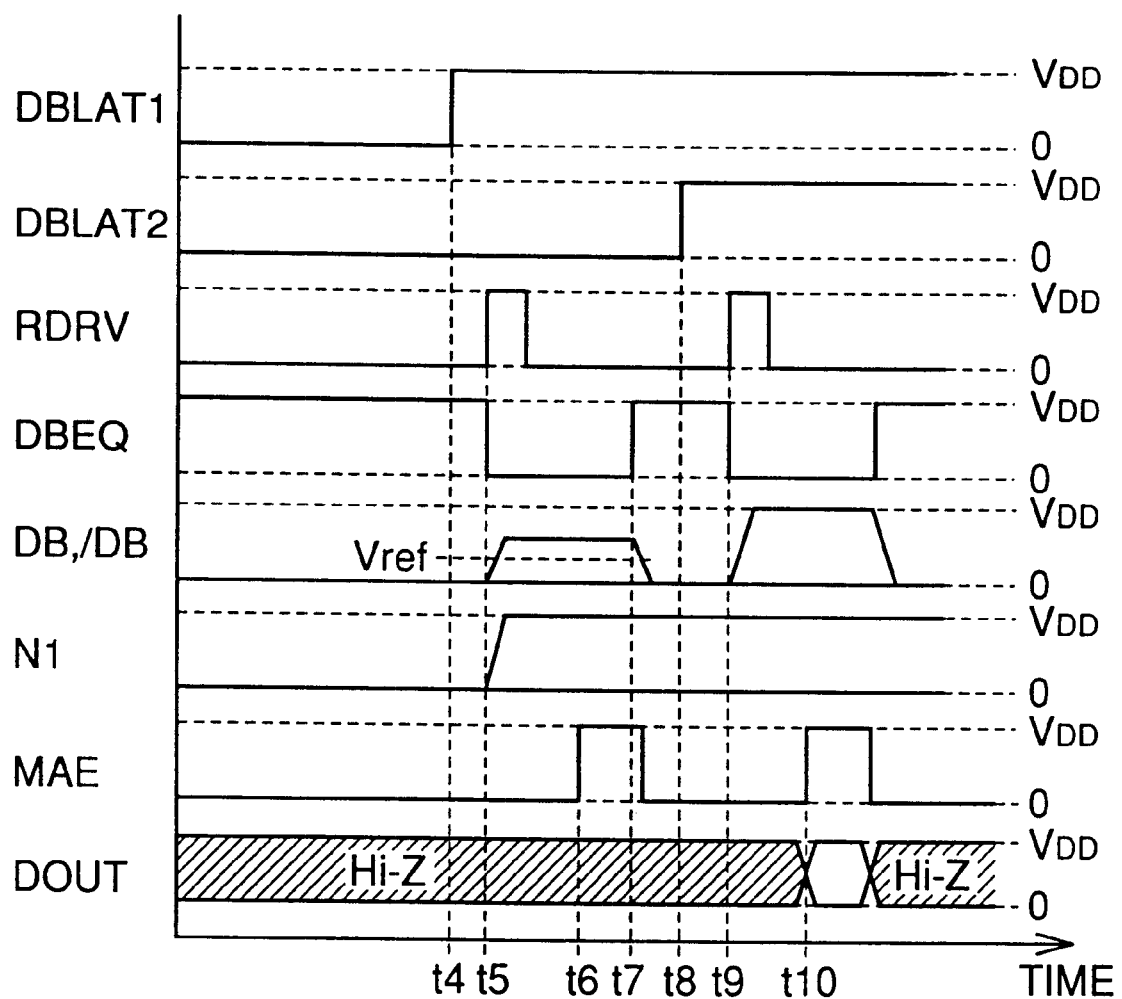
FIG. 10 is a timing chart illustrating a multi-bit test mode operation of the read circuit shown in FIG. 9.

The operation during the time period from t0 to t3 in the present embodiment is the same as that in the first embodiment, and thus, it is not illustrated in FIG. 10.

At time t4, preamplifier activation signal PAE attains an "H" level. Thus, the potential differences on the selected I/O line pairs are amplified by preamplifiers PAM0–PAM3, and are output to data line pairs PD0, /PD0–PD3, /PD3. The data from data line pairs PD0, /PD0–PD3, /PD3 are all provided to data bus driving circuit 300. Meanwhile, signal DBLAT1 attains an active state.

Up to time t5, data buses DB, /DB are equalized to the ground potential by data bus equalization circuit 320. After the equalization of the data buses is released at time t5, the data transmitted via data line pairs PD0, /PD0–PD3, /PD3 are compared by data bus driving circuit 300. According to the comparison result, data buses DB, /DB are driven to corresponding potential levels in response to the activation of signal RDRV. Accordingly, RS flip-flop circuit 658 within data retaining circuit 600 retains data corresponding to the comparison result.

Here, different from the case in the first embodiment, even if signal MAE attains an active state at time t6, main amplifier unit 500 is not activated, because signal DBLAT2 remains at the "L" level.

The operation after time t7 is the same as in FIG. 8.

With such a configuration, as described above, it is possible to avoid collision of data output from a plurality of chips when the test programs are performed with the input/output pins of the chips being short-circuited. This also prevents excessive load from being applied to the test device.

Third Embodiment

Figure 11:
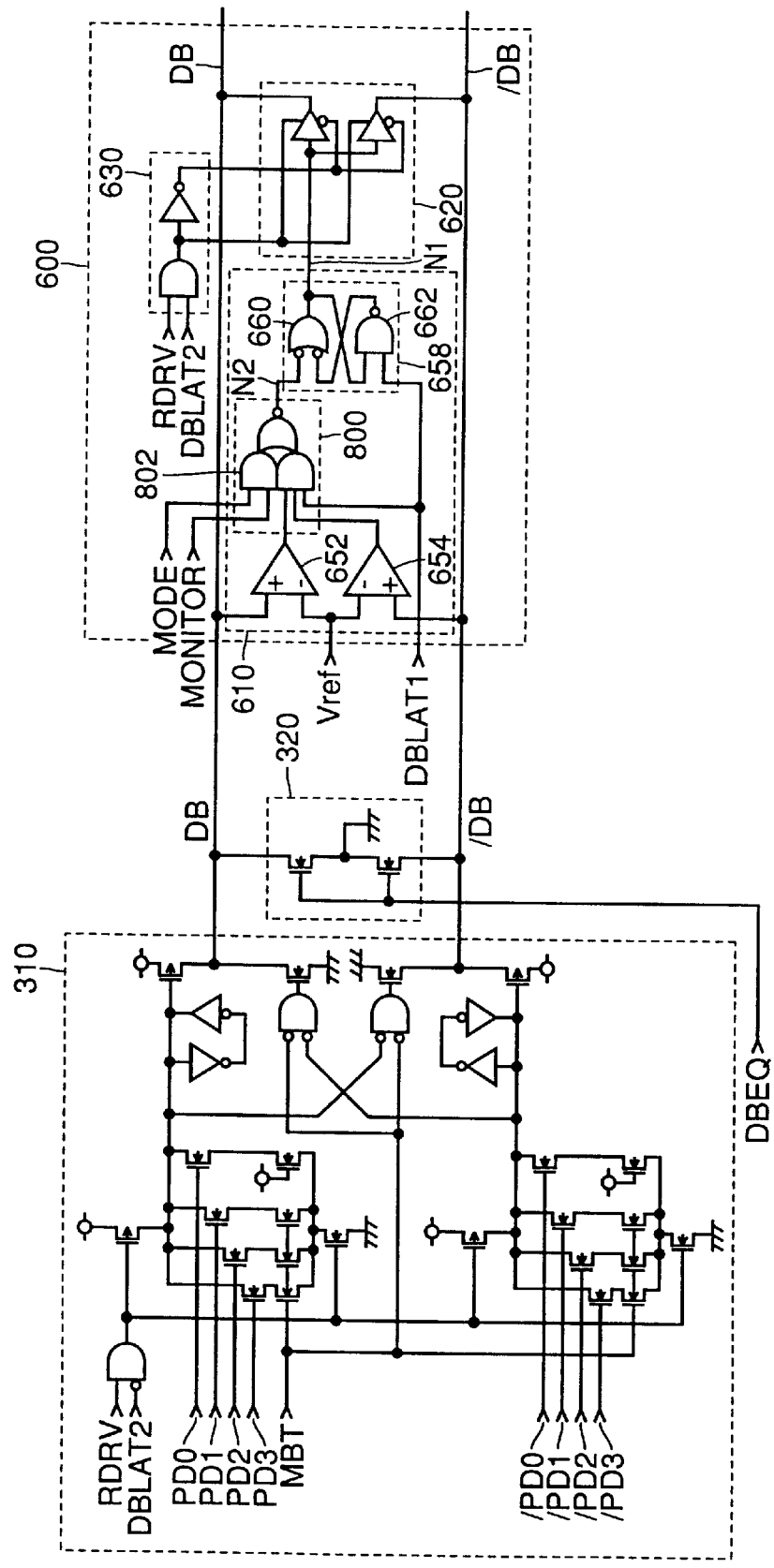
FIG. 11 is a schematic block diagram illustrating a configuration of a read circuit according to a third embodiment of the present invention.

The configuration of a read circuit according to the third embodiment of the present invention will now be described with reference to FIG. 11.

Figure 9:
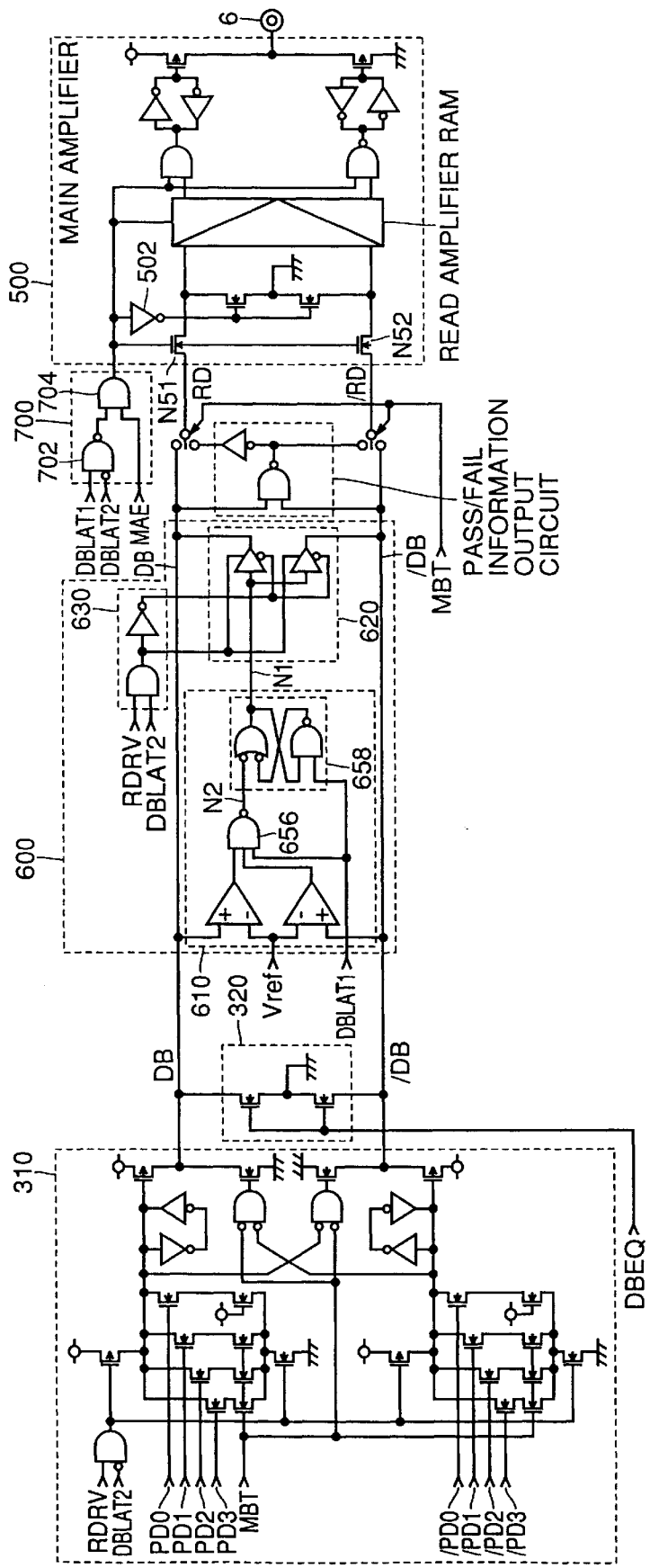
FIG. 9 is a schematic block diagram illustrating a configuration of a read circuit according to a second embodiment of the present invention.

The read circuit of the present embodiment is different from those in the first and second embodiments shown in FIGS. 5 and 9, respectively, in that a set signal generating circuit 800 is provided, instead of NAND circuit 656 of the first and second embodiments, to supply a set signal to RS flip-flop circuit 658.

Otherwise, the read circuit of the present embodiment has a configuration identical to those of the first and second embodiments, and thus, the same portions are denoted by the same reference characters, and description thereof is not repeated.

Set signal generating circuit 800 is configured to receive an internal signal MODE and an internal signal monitor enable signal MONITOR output from control circuit 14 in DRAM 1000, and to set, when signal MONITOR attains an "H" level, the logic value of internal signal MODE to RS flip-flop circuit 658 within detection retaining circuit 610.

Specifically, set signal generating circuit 800 includes a composite logic gate 802 that outputs, to node N2, the NOR logical operation result of: 1) the AND logical operation result of the outputs of differential amplifier circuit 652, 654 and signal DBLAT1; and 2) the AND logical operation result of signals MODE and MONITOR.

Here, signal MODE may be a test mode signal output from control circuit 14 according to the designation of the test mode, or another internal control signal output from control circuit 14.

Signal MONITOR is a signal output from control signal 14 according to the combination of externally supplied control signals and the address signal.

With the configuration as described above, it is possible to output the logic value of signal MODE to the outside of DRAM 1000, by reading out the data retained in data retaining circuit 600.

If a signal reflecting the internal state transition of DRAM 1000 is selected as signal MODE, for example, it is possible to monitor and verify the operation of the DRAM 1000 from the outside.

Assume, for example, that a test mode signal is used as signal MODE, as described above. In this case, to ensure that DRAM 1000 is tested after it is put in a prescribed test mode, it is possible to confirm that DRAM 1000 has entered the test mode and the internal signal of the chip has attained a desired logic value, before starting the test program.

Figure 12:
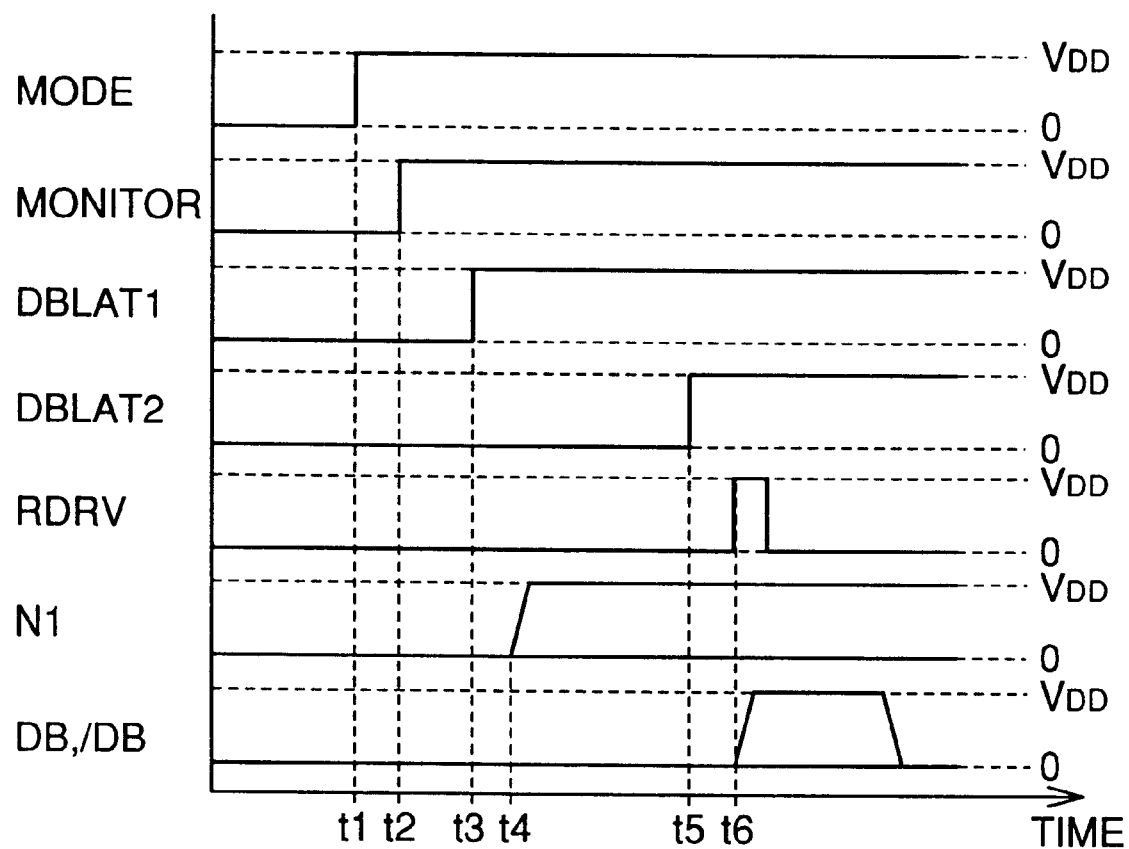
FIG. 12 is a timing chart illustrating an operation of the read circuit shown in FIG. 11.
Figure 13:
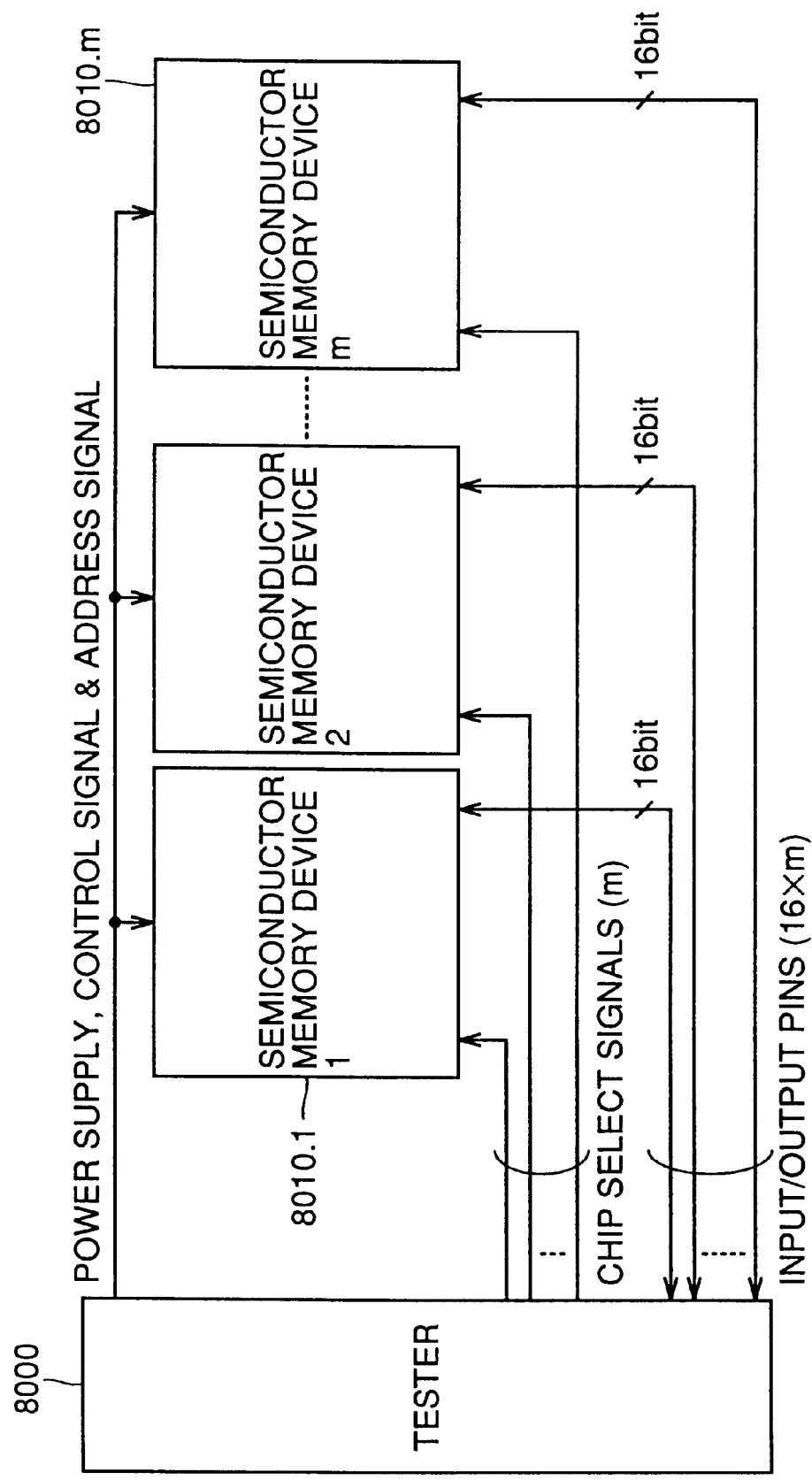
FIG. 13 a schematic diagram illustrating connection between a conventional tester 8000 and semiconductor memory devices 8010.1–8010.m to be measured.

The operation of the read circuit of FIG. 11 will be described with reference to the timing chart shown in FIG. 12. Note that, referring to FIGS. 11 and 12, internal signal MODE is at an "L" level in the normal operating mode, and at an "H" level in a prescribed test mode.

At time t1, a command and an address signal are externally input to force DRAM 1000 to enter the test mode.

Thereafter, at time t2, internal signal monitor enable signal MONITOR is set to an "H" level, and subsequently, at time t3, signal DBLAT1 is set to an "H" level. Thus, at time t4, RS flip-flop circuit 658 enters the set state.

Further, signal DBLAT2 is set to an "H" level at time t5 and signal RDRV is activated at time t6, so that data are read out of DRAM 1000.

Thus, the logic value of signal MODE can be taken out via the output buffer to the outside of DRAM 1000.

Accordingly, in the present embodiment, it is possible to perform the testing operation of DRAM 1000, as in the first and second embodiment, with externally monitoring the internal operation states thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a control circuit for generating a plurality of internal control signals and first and second data output control signals to control an operation of said semiconductor integrated circuit device;
   an internal circuit controlled by said plurality of internal control signals, said internal circuit including
- a first driving circuit having first and second output nodes, for driving a potential level difference between said first and second output nodes to a first potential difference according to data being output;
- a first data bus pair for transmitting the data output from said first and second output nodes of said first driving circuit;
- a data retaining circuit for retaining data corresponding to one of a set state and a reset state, the data retaining circuit being allowed to shift from the reset state to the set state according to a potential level of said first data bus pair when the first data output control signal is in an active state;
- a second driving circuit having third and fourth output nodes, responsive to activation of said second data output control signal for driving a potentials of said third and fourth output nodes each having an amplitude larger than said first potential difference according to said data retained in said data retaining circuit; and
- a data output circuit for outputting data corresponding to the potentials on said third and fourth output nodes to the outside of said semiconductor integrated circuit device.

2. The semiconductor integrated circuit device according to claim 1, wherein said data output circuit is inactivated, and shifts from an inactive state to an active state according to a designation from the outside of said semiconductor integrated circuit device when the first data output control signal is in the active state.

3. The semiconductor integrated circuit device according to claim 1, wherein said data retaining circuit is further controlled by said control circuit, and retains a level of at least one of said plurality of internal control signals in response to a designation from the outside of said semiconductor integrated circuit device.

4. The semiconductor integrated circuit device according to claim 3, wherein said data retaining circuit includes
- a flip-flop circuit set, according to a set signal when the first data output control signal is in the active state,
- a detection circuit for detecting the potential level of said first data bus pair attaining a prescribed value, and
- a logic circuit receiving an output of said detection circuit and at least one of said plurality of internal control signals as inputs, being controlled by said control circuit, and selectively providing an output having a level corresponding to one of the inputs as said set signal to said flip-flop circuit.

5. The semiconductor integrated circuit device according to claim 1, further comprising a second data bus pair coupled between said first data bus pair and said data output circuit, for transmitting data on said first data bus pair to said data output circuit in a normal operation mode, and transmitting test result data corresponding to the potentials on said third and fourth output nodes to said data output circuit in a test mode.

6. The semiconductor integrated circuit device according to claim 5, further comprising a test result output circuit for outputting the test result data to said second data bus pair according to the potentials on said third and fourth output nodes.

7. The semiconductor integrated circuit device according to claim 6, further comprising a switch selectively providing one of the test result data and data on said first data bus pair to said second data bus pair in response to a test mode signal.

8. The semiconductor integrated circuit device according to claim 1, wherein said third and fourth output nodes are coupled to said first data bus pair.

9. A semiconductor integrated circuit device, comprising:
- a control circuit generating a plurality of internal control signals and first and second data output control signals to control an operation of said semiconductor integrated circuit device;
- a memory circuit controlled by said plurality of internal control signals for sending/receiving memory data to/from an outside of said semiconductor integrated circuit device,
  said memory circuit including
  - a plurality of memory cell sub-blocks,
    - each of said plurality of memory cell sub-blocks having a plurality of memory cells arranged in rows and columns for storing said memory data, and
  - a first driving circuit having first and second output nodes, controlled by said control circuit, for driving a potential level difference between said first and second output nodes to a first potential difference, according to the memory data from a memory cell selected from said plurality of memory cell sub-blocks in a normal operation, and according to a comparison result of a plurality of memory data read out in batches respectively from said plurality of memory cell sub-blocks in a test operation;
- a first data bus pair for transmitting data output from said first and second output nodes of said first driving circuit;
- a data retaining circuit for retaining data corresponding to one of a set state and a reset state, the data retaining circuit being allowed to shift from the reset state to the set state according to a potential level of said first data bus pair when the first data output control signal is in an active state;
- a second driving circuit having third and fourth output nodes, responsive to activation of said second data output control signal for driving potentials of said third and fourth output nodes each having an amplitude that is larger than said first potential difference according to said data retained in said data retaining circuit; and
- a data output circuit for outputting data corresponding to the potentials on said third and fourth output nodes to the outside of said semiconductor integrated circuit device.

10. The semiconductor integrated circuit device according to claim 9, wherein said data output circuit is inactivated according to a designation from the outside of said semiconductor integrated circuit device when the first data output control signal is in the active state.

11. The semiconductor integrated circuit device according to claim 9, wherein said data retaining circuit is further controlled by said control circuit, and retains a level of at least one of said plurality of internal control signals in response to a designation from the outside of said semiconductor integrated circuit device.

12. The semiconductor integrated circuit device according to claim 11, wherein said data retaining circuit includes
- a flip-flop circuit set, according to a set signal when the first data output control is in the active state,
- a detection circuit for detecting the potential level of said first data bus pair attaining a prescribed value, and
- a logic circuit receiving an output of said detection circuit and at least one of said plurality of internal control signals as inputs, being controlled by said control circuit, and selectively providing said flip-flop circuit with an output at a level corresponding to one of the inputs as said set signal.

13. The semiconductor integrated circuit device according to claim 9, further comprising a second data bus pair coupled between said first data bus pair and said data output circuit, for transmitting data on said first data bus pair to said data output circuit in a normal operation mode, and transmitting test result data corresponding to the potentials on said third and fourth output nodes to said data output circuit in a test mode.

14. The semiconductor integrated circuit device according to claim 13, further comprising a test result output circuit for outputting the test result data to said second data bus pair according to the potentials on said third and fourth output node.

15. The semiconductor integrated circuit device according to claim 14, further comprising a switch selectively providing one of the test result data and data on said first data bus pair to said second data bus pair in response to a test mode signal.

16. The semiconductor integrated circuit device according to claim 9, wherein said third and fourth output nodes are coupled to said first data bus pair.

* * * * *